US008530865B2

(12) United States Patent
Shichi et al.

(10) Patent No.: US 8,530,865 B2
(45) Date of Patent: *Sep. 10, 2013

(54) GAS FIELD ION SOURCE, CHARGED PARTICLE MICROSCOPE, AND APPARATUS

(75) Inventors: Hiroyasu Shichi, Tokyo (JP); Shinichi Matsubara, Komae (JP); Takashi Ohshima, Saitama (JP); Satoshi Tomimatsu, Hitachinaka (JP); Tomihiro Hashizume, Hatoyama (JP); Tohru Ishitani, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,104

(22) Filed: Jan. 20, 2012

(65) Prior Publication Data

US 2012/0119086 A1 May 17, 2012

Related U.S. Application Data

(63) Continuation of application No. 12/318,583, filed on Dec. 31, 2008, now Pat. No. 8,115,184.

(30) Foreign Application Priority Data

Jan. 7, 2008 (JP) ................................. 2008/000477

(51) Int. Cl.
*H01J 49/26* (2006.01)
*H01J 49/00* (2006.01)
*H01J 37/08* (2006.01)

(52) U.S. Cl.
USPC ................ 250/492.21; 250/492.1; 250/492.3; 250/493.1; 250/309

(58) Field of Classification Search
USPC .................. 250/492.1, 492.21, 492.3, 493.1, 250/309
See application file for complete search history.

(56) References Cited

U.S. PATENT DOCUMENTS 4,139,773 A * 2/1979 Swanson .................. 250/423 R
4,638,209 A * 1/1987 Asamaki et al. ........... 313/359.1

(Continued)

FOREIGN PATENT DOCUMENTS

JP     58-85242      11/1981
JP     63-216249      3/1987

(Continued)

OTHER PUBLICATIONS

Office Action from the Japanese Patent Office, corresponding to Japanese Patent Application No. 2008-000477, dated Mar. 13, 2012, pp. 1-8.

(Continued)

*Primary Examiner* — David A Vanore
(74) *Attorney, Agent, or Firm* — Stites & Harbison, PLLC; Juan Carlos A. Marques, Esq.; Nicholas B. Trenkle, Esq.

(57) ABSTRACT

A gas field ion source that can simultaneously increase a conductance during rough vacuuming and reduce an extraction electrode aperture diameter from the viewpoint of the increase of ion current. The gas field ion source has a mechanism to change a conductance in vacuuming a gas molecule ionization chamber. That is, the conductance in vacuuming a gas molecule ionization chamber is changed in accordance with whether or not an ion beam is extracted from the gas molecule ionization chamber. By forming lids as parts of the members constituting the mechanism to change the conductance with a bimetal alloy, the conductance can be changed in accordance with the temperature of the gas molecule ionization chamber, for example the conductance is changed to a relatively small conductance at a relatively low temperature and to a relatively large conductance at a relatively high temperature.

13 Claims, 13 Drawing Sheets

(56) References Cited

U.S. PATENT DOCUMENTS

| | | | |
|---|---|---|---|
| 6,538,254 B1 | 3/2003 | Tomimatsu et al. | |
| 6,781,125 B2 | 8/2004 | Tokuda et al. | |
| 7,238,939 B2 * | 7/2007 | Katagiri et al. | 250/310 |
| 7,368,727 B2 * | 5/2008 | Ward | 250/423 R |
| 7,439,521 B2 * | 10/2008 | Burtner et al. | 250/423 R |
| 7,476,869 B2 * | 1/2009 | Burtner et al. | 250/423 R |
| 7,485,873 B2 * | 2/2009 | Ward et al. | 250/423 F |
| 7,488,952 B2 * | 2/2009 | Ward et al. | 250/423 F |
| 7,495,232 B2 * | 2/2009 | Ward et al. | 250/423 F |
| 7,504,639 B2 * | 3/2009 | Ward et al. | 250/423 F |
| 7,511,279 B2 * | 3/2009 | Ward et al. | 250/423 F |
| 7,511,280 B2 * | 3/2009 | Ward et al. | 250/423 F |
| 7,518,122 B2 * | 4/2009 | Ward et al. | 250/423 F |
| 7,521,693 B2 * | 4/2009 | Ward et al. | 250/423 F |
| 7,554,096 B2 * | 6/2009 | Ward et al. | 250/423 F |
| 7,554,097 B2 * | 6/2009 | Ward et al. | 250/423 F |
| 7,557,358 B2 * | 7/2009 | Ward et al. | 250/423 F |
| 7,557,359 B2 * | 7/2009 | Ward et al. | 250/423 F |
| 7,557,360 B2 * | 7/2009 | Ward et al. | 250/423 F |
| 7,557,361 B2 * | 7/2009 | Ward et al. | 250/423 F |
| 7,582,885 B2 * | 9/2009 | Katagiri et al. | 250/492.3 |
| 7,781,743 B2 * | 8/2010 | Katagiri et al. | 250/425 |
| 7,786,451 B2 * | 8/2010 | Ward et al. | 250/423 F |
| 7,786,452 B2 * | 8/2010 | Ward et al. | 250/423 F |
| 8,115,184 B2 * | 2/2012 | Shichi et al. | 250/492.21 |
| 2005/0052103 A1 | 3/2005 | Katagiri et al. | |
| 2009/0152462 A1 * | 6/2009 | Ishitani et al. | 250/307 |
| 2009/0173888 A1 * | 7/2009 | Shichi et al. | 250/397 |
| 2009/0230299 A1 * | 9/2009 | Shichi et al. | 250/282 |

FOREIGN PATENT DOCUMENTS

| | | |
|---|---|---|
| JP | 1-221847 | 3/1988 |
| JP | 02-109240 | 4/1990 |
| JP | 2002-150990 | 5/2002 |
| JP | 2007-19045 | 1/2007 |
| JP | 2008-140557 | 6/2008 |
| WO | WO 99/05506 | 7/1998 |

OTHER PUBLICATIONS

Morgan, John, et al., "An Introduction to the Helium Ion Microscope", Microscopy Today, vol. 14, No. 4, Jul. 2006, pp. 24-31.

Kuo, Hong-Shi, et al., "Preparation and Characterization of Single-Atom Tips", Nano Letters, vol. 4, No. 12, 2004, pp. 2379-2382.

* cited by examiner

GAS FIELD ION SOURCE, CHARGED PARTICLE MICROSCOPE, AND APPARATUS

CLAIM OF PRIORITY

This application is a Continuation application of U.S. application Ser. No. 12/318,583 filed on Dec. 31, 2008, which claims priority from Japanese patent application JP 2008-000477 filed on Jan. 7, 2008, the content of which is hereby incorporated by reference into this application.

FIELD OF THE INVENTION

The present invention relates to a gas field ion source to produce ions and a charged particle microscope to observe the surface and the interior of a sample of a semiconductor device or a new material. Further, the present invention relates to a composite apparatus comprising an ion beam processor and a charged particle microscope and a composite apparatus comprising an ion beam microscope and an electron microscope. In addition, the present invention relates to an analysis and inspection apparatus to which an ion beam microscope and an electron microscope are applied.

BACKGROUND OF THE INVENTION

It is possible to observe the structure of the surface of a sample by irradiating and scanning the sample with electrons and detecting secondary charged particles emitted from the sample. This is called a scanning electron microscope (hereunder abbreviated to SEM). Meanwhile, it is also possible to observe the structure of the surface of a sample by irradiating and scanning the sample with an ion beam and detecting secondary charged particles emitted from the sample. This is called a scanning ion microscope (hereunder abbreviated to SIM). If a sample is irradiated with such kind of light-mass ions as hydrogen or helium in particular, sputtering relatively reduces and the sample can be well observed.

Here, the excitation region of secondary electrons caused by the intrusion of hydrogen or helium into a sample surface is more localized on the sample surface than the case of electron irradiation and hence the characteristic in that an SIM image is far more sensitive to sample surface information than an SEM image is expected. From the viewpoint of a microscope further, ions are heavier than electrons and hence ions are characterized in that the diffraction effect can be ignored in beam convergence and an image of a very large focal depth can be obtained.

Further, it is also possible to obtain information reflecting the internal structure of a sample by irradiating the sample with an electron beam or an ion beam and detecting the electrons or the ions having permeated the sample. This is called a transmission electron microscope or a transmission ion microscope. If a sample is irradiated with such kind of light-mass ions as hydrogen or helium in particular, the proportion of the ions permeating the sample increases and the sample can be well observed.

A gas field ion source: has a narrow ion energy width and a small ion source size; hence is expected to produce a minute beam; and is an ion source suitable for such a scanning ion microscope and a transmission ion microscope. JP-A-Sho58 (1983)-85242 discloses that the ion source performance improves when a gas field ion source uses an emitter tip having a minute protrusion at the apex thereof. Further, H.-S. Kuo, I.-S. Hwang, T.-Y. Fu, J.-Y. Wu, C.-C. Chang, and T.-T. Tsong, Nano Letters 4 (2004) 2379 disclose that a minute protrusion at the apex of an emitter tip is made of a second metal that is different from the material for the emitter tip.

Furthermore, J. Morgan, J. Notte, R. Hill, and B. Ward, Microscopy Today, Jul. 14 (2006) 24 disclose a scanning ion microscope on which a gas field ion source to emit helium ions is mounted.

Yet further, JP-A-Sho63 (1988)-216249 discloses a gas field ion source equipped with a cylindrical liquid nitrogen container so as to surround an ion generating section and other sections. The document also discloses a gas field ion source that: is provided with a heating means for degassing to the atmosphere side of a vacuum chamber of the gas field ion source and a cooling chamber to cool the vacuum chamber outside the heating means; and thereby reduces the consumption of liquid nitrogen.

In addition, JP-A-Hei1(1989)-221847 discloses: a selector switch to connect a high voltage line for an extraction electrode to a high voltage line for an emitter tip; and a gas field ion source that can prevent electric discharge between the emitter tip and the extraction electrode after forced discharging treatment, namely conditioning treatment, between the outer wall of the ion source and the emitter tip.

Further, there is an example of processing that uses the phenomenon wherein particles constituting a sample are emitted from the sample by the sputtering of ions when the sample is irradiated with an ion beam. It is also possible to minutely process a sample. Generally on this occasion, a focused ion beam apparatus (hereunder abbreviated to FIB apparatus) that uses a liquid metal ion source (hereunder abbreviated to LMIS) is preferably used. Furthermore, in recent years, a composite FIB-SEM apparatus formed by combining an SEM and a focused ion beam apparatus has also been used. By the FIB-SEM apparatus, it is possible to form a square hole at an intended portion by the irradiation of an FIB and observe a cross section thereof with the SEM.

For example, JP-A-2002-150990 proposes an apparatus to observe and analyze defects and foreign matters by forming a square hole in the vicinity of an abnormal portion in a sample with an FIB and observing the cross section of the square hole with an SEM.

Furthermore, WO99/05506 proposes a technology of picking up a minute sample for transmission electron microscope observation from a bulk sample with an FIB and a probe.

SUMMARY OF THE INVENTION

It is possible to observe a sample at a high signal-to-noise ratio with an ion microscope using a gas field ion source if an ion beam having a large current density can be obtained on the sample. A larger ion radiation angle current density of the gas field ion source is desirable in order to obtain a larger current density on a sample. The pressure of an ion material gas introduced into an emitter tip chamber is raised to about $10^{-2}$ to 10 Pa in order to increase the ion radiation angle current density. The introduced gas is differentially evacuated through an aperture of an extraction electrode. A larger aperture diameter is desirable for roughly vacuuming a gas molecule ionization chamber. If the aperture of the extraction electrode is large however, when the ion material gas pressure is raised to about 1 Pa or higher, the degree of vacuum at the exterior of the gas molecule ionization chamber deteriorates, an ion beam collides with a neutral gas and is neutralized, and thereby the ion current lowers. Further, another problem has been that, if the number of gas molecules increases at the exterior of the gas molecule ionization chamber, the gas molecules having collided with a radiation shield or the vacuum chamber wall having a higher temperature than the gas molecule ionization chamber collide with the gas molecule ionization chamber and thereby the temperature of the gas molecule ionization chamber rises and the ion current lowers. The first challenge of the present invention in a gas field ion source is the compatibility of the increase of a conductance during rough vacuuming and the reduction of the extraction electrode aperture diameter from the viewpoint of the increase of ion current.

Further, another problem has been that, if an emitter tip absorbs impurity molecules in a gas field ion source, ions are emitted from the absorbed portion in some cases and the ion emission from the apex of the emitter tip is destabilized. That is, the second challenge of the present invention is how to reduce impurities around an emitter tip, namely how to secure a high degree of vacuum, in a gas molecule ionization chamber.

Furthermore, it is important to increase the gas molecule density in the vicinity of a tip in order to obtain ion current abundantly in a gas field ion source. A gas molecule density per unit pressure is inversely proportional to a gas temperature and it is important to cool a gas together with an emitter tip. In general, a gas field ion source has to be connected to a high temperature region through a good conductor and has to face an ion beam lens of a high temperature in order to apply a high voltage to an emitter tip and hence it has been difficult to freeze the emitter tip to a cryogenic temperature. The third challenge of the present invention is how to secure a cryogenic temperature of an emitter tip.

In addition, many of the means for cooling a gas field ion source contain factors generating mechanical vibration and they tend to cause an emitter tip to vibrate. The fourth challenge of the present invention is how to reduce the mechanical vibration of an emitter tip.

Those are the challenges based on the provision of a highly stable gas field ion source yielding a large electric current and a charged particle microscope on which the gas field ion source is mounted. An object of the present invention is to provide a gas field ion source that solves the challenges and a charged particle microscope, on which the gas field ion source is mounted, having a high resolution and a large focal depth.

Another object of the present invention is to provide: an apparatus to form a cross section in a sample with an ion beam and observe the cross section with an ion microscope, in place of an apparatus to form a cross section in a sample with an ion beam and observe the cross section with an electron microscope; and a method for observing the cross section.

Yet another object of the present invention is to provide: an apparatus that can handle sample observation with an ion microscope and sample observation and element analysis with an electron microscope in the single apparatus; an analyzer to observe and analyze defects and foreign matters; and an inspection apparatus.

In a gas field ion source, the first challenge of the present invention that is the compatibility of the increase of a conductance during rough vacuuming and the reduction of the extraction electrode aperture diameter from the viewpoint of the increase of ion current can be solved by installing a mechanism to change a conductance in vacuuming a gas molecule ionization chamber. In particular, the first challenge can be solved by installing the mechanism to change a conductance in proportion to the temperature of the gas molecule ionization chamber and forming parts of the members constituting the mechanism with a bimetal alloy. Otherwise, in a charged particle microscope, the first challenge can be solved by preparing a charged particle microscope characterized by having a mechanism to change a conductance in vacuuming a gas molecule ionization chamber in accordance with whether or not an ion beam is extracted from the gas molecule ionization chamber.

In a gas field ion source, the second challenge of the present invention that is how to secure a high degree of vacuum in a gas molecule ionization chamber in order to stabilize ion emission can be solved by installing a temperature adjustment system that allows the gas molecule ionization chamber to be heated. In particular, the second challenge can be solved by attaching an electrical resistance heater to the outer wall of a gas molecule ionization chamber.

In a gas field ion source, the third challenge of the present invention that is how to secure a cryogenic temperature of an emitter tip can be solved by introducing a system that can connect and disconnect by switching at least one of the electric wires of an electric resistance heater. Further, it is possible to heat an anode emitter tip by installing the acicular anode emitter tip on a filament and electrifying the filament and the third challenge can be solved by making it possible to connect and disconnect by switching at least one of the wires for electrifying the filament. In particular, the third challenge can be solved by forming a system that can connect and disconnect by switching at least one of the wires with a bimetal alloy. Otherwise the third challenge can be solved by installing a system to cool at least one of the electrodes of an electrostatic lens that is located in the ion extraction direction from a gas molecule ionization chamber and faces the gas molecule ionization chamber.

In a gas field ion source, the fourth challenge of the present invention that is how to reduce the mechanical vibration of an emitter tip can be solved by using a solid state coolant that is in the state of a gas at ordinary temperature under atmospheric pressure as the coolant in a system to cool at least one of the electrodes of an electrostatic lens. Otherwise the fourth challenge can be solved by making an emitter tip retention mechanism movable from the gas molecule ionization chamber and mechanically connecting the emitter tip retention mechanism to a cooling system with a flexible member.

The present invention makes it possible to provide a gas field ion source that can: simultaneously increase a conductance during rough vacuuming and reduce an extraction electrode aperture diameter from the viewpoint of the increase of ion current; and obtain an ion beam of a large electric current.

Further, the present invention makes it possible to provide a gas field ion source that can: realize a higher degree of vacuum in a gas molecule ionization chamber; and emit highly stable ions.

Furthermore, the present invention makes it possible to provide a gas field ion source that can: realize a cryogenic temperature of an emitter tip; and obtain an ion beam of a large electric current. Yet further, the present invention makes it possible to provide a gas field ion source and an ion microscope that can: realize the reduction of mechanical vibration; and secure high resolution observation.

In addition, the present invention makes it possible to provide a gas field ion source that is suitable for an apparatus to: form a cross section by processing a sample with an ion beam; and observe the cross section with an ion microscope.

DETAILED DESCRIPTION OF THE PREFERRED EMBODIMENTS

Embodiments according to the present invention are hereunder explained in reference to drawings.

First Embodiment

Figure 1:
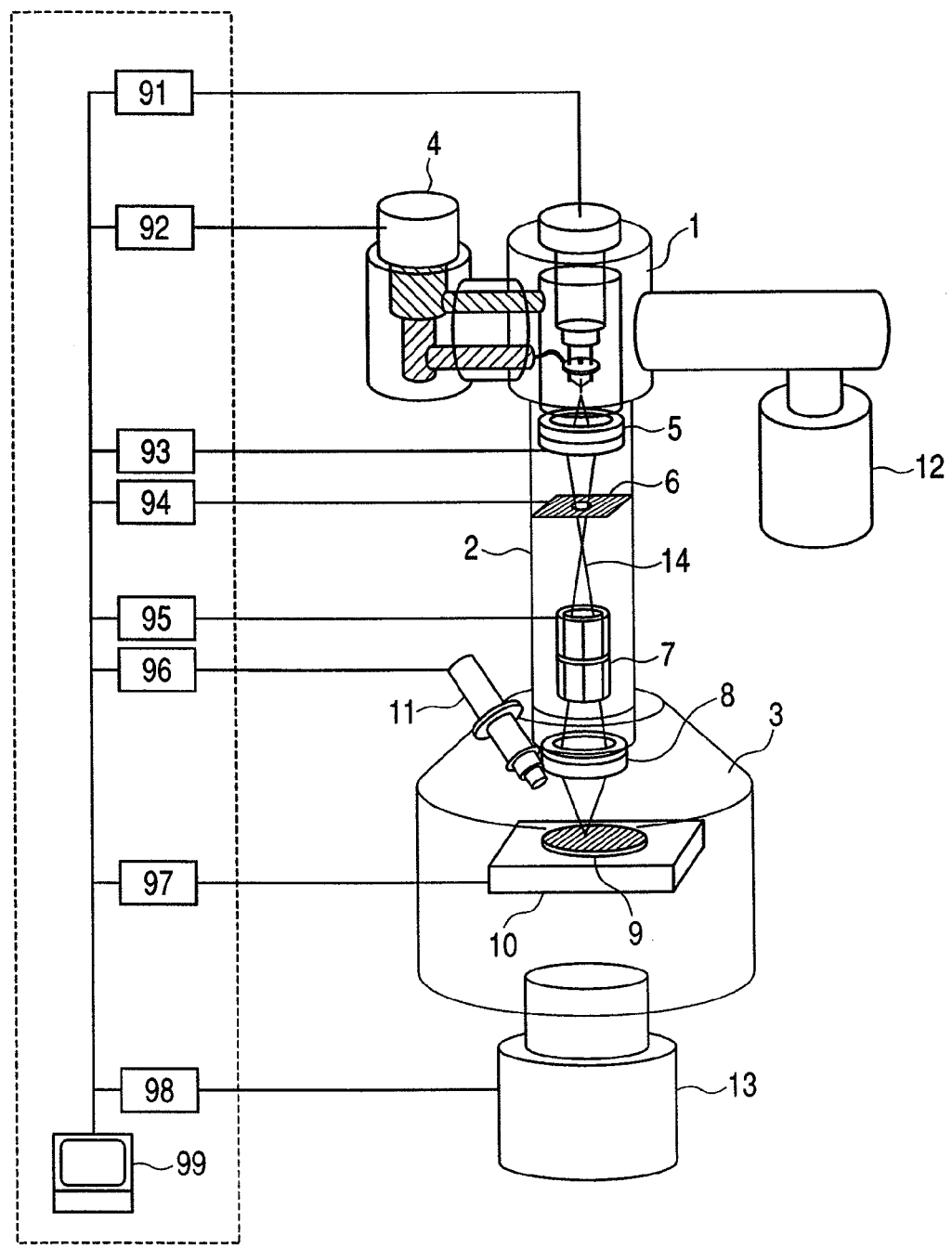
FIG. 1 is a general configuration diagram of an ion beam microscope according to the first embodiment.

A general configuration diagram of an ion beam microscope according to the first embodiment is shown in FIG. 1. The present apparatus comprises a gas field ion source 1, an ion beam irradiation column 2, a vacuum sample chamber 3, and others. A refrigerator 4 is connected to the gas field ion source 1. An electrostatic type condenser lens 5, a beam limiting aperture 6, a beam scanning electrode 7, an electrostatic type object lens 8 and others are stored in the ion beam irradiation column 2. A sample stage 10 on which a sample 9 is mounted, a secondary particle detector 11, and others are stored in the vacuum sample chamber 3. Further, an ion source vacuuming pump 12 and a sample chamber vacuuming pump 13 are attached. Here, it goes without saying that the interior of the ion beam irradiation column 2 is also maintained in the state of vacuum.

As units (or referred to as sections) to control the present microscope, a gas field ion source controller 91, a refrigerator controller 92, a lens controller 93, a beam limiting aperture controller 94, an ion beam scanning controller 95, a secondary electron detector controller 96, a sample stage controller 97, a vacuuming pump controller 98, a computer 99, and others are arranged. Here, the computer 99 is provided with an image display section to display images generated on the basis of signals detected with the secondary particle detector 11 and information input by an information input means.

Here, the sample stage 10 is equipped with a rectilinear transfer mechanism in two orthogonal directions on a sample stage plane, a rectilinear transfer mechanism in the direction vertical to the sample stage plane, a rotation mechanism on the sample stage plane, and an inclination mechanism to change the irradiation angle of an ion beam 14 to a sample 9 by rotating around an inclined axis. Those mechanisms are controlled with the sample stage controller 97 by the command from the computer 99.

Firstly, the fabrication of an emitter tip is described. An emitter tip comprises a tungsten wire having a diameter of about 100 to 400 m and an axis orientation of <111> and the apex of the emitter tip has a curvature radius of several tens nanometers and is formed sharply. Further, iridium is deposited to the apex of the emitter tip by vacuum vapor deposition in another vacuum chamber. Thereafter, iridium atoms are transferred to the apex of the emitter tip by heating at a high temperature and thereby a pyramid of iridium atoms on the order of nanometers is formed. This is referred to as a nano-pyramid. One atom exists at the apex of the nano-pyramid and three or six atoms exist under the atom. A layer of ten or more atoms exists yet under the atoms.

Here, although a fine tungsten wire and iridium are used in the present embodiment, it is also possible to use a fine wire of molybdenum. Further, although iridium is used for coating in the present embodiment, it is also possible to use platinum, rhenium, osmium, palladium, rhodium, and the like. When helium is used as the ionized gas, it is important that the evaporation strength of a metal is larger than the electric field strength at which helium is ionized and platinum, rhenium, osmium, and iridium are preferable. Here, in the case of hydrogen, platinum, rhenium, osmium, palladium, rhodium, and iridium are preferable. Further, as a method for coating a wire with such a metal, besides the vacuum vapor deposition method, a method of plating in a solution is also acceptable. Furthermore, as a method for forming a pyramid on the order of nanometers, namely a nano-pyramid, at the apex of an emitter tip, it is also possible to apply electric field evaporation or ion beam irradiation in vacuum, or the like and thereby a nano-pyramid of tungsten or molybdenum can be formed. When a tungsten wire of <111> is used for example, the apex is characterized by comprising three atoms.

Figure 2:
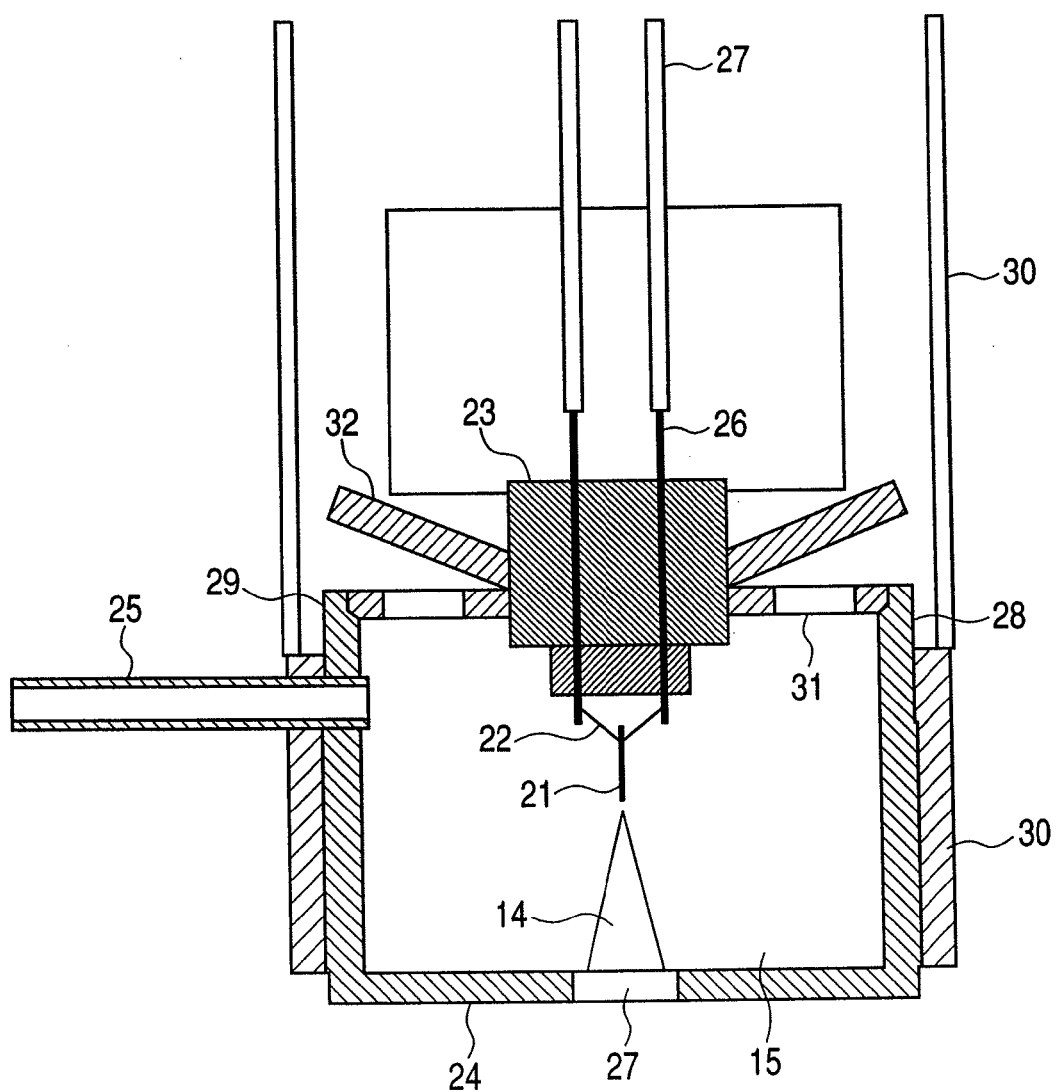
FIG. 2 is a diagrammatic illustration showing the vicinity of an emitter tip in a gas field ion source according to the first embodiment.

A diagrammatic illustration of the vicinity of an emitter tip in a gas field ion source according to the present embodiment is shown in FIG. 2. The vicinity of an emitter tip in a gas field ion source comprises an emitter tip 21, a filament 22, a filament mount 23, an extraction electrode 24, a gas feed pipe 25, and other components. The emitter tip 21 is fixed to the filament 22. The filament 22 is fixed to support bars 26 of the filament mount at both the ends thereof.

The extraction electrode 24 is placed opposite the emitter tip 21 and has a small aperture 27 to extract an ion beam 14. A cylindrical sidewall 28 and a top plate 29 are connected to the extraction electrode 24 and surround the emitter tip 21. Further, a cylindrical electric resistance heater 30 is attached around the cylindrical sidewall.

Further, on-off valves are attached to the top plate 29. That is, the top plate 29 has openings 31 and lids 32 to seal the openings. A bimetal that deforms in proportion to temperature is used as the material for the lids and the lids can be opened and closed by the temperature change of the bimetal. Here, the chamber surrounded by the extraction electrode, the sidewall, and the top plate is called a gas molecule ionization chamber. Further, in the case of FIG. 2, the filament mount is embedded into the top plate and the emitter tip attached to the filament mount is located inside the gas molecule ionization chamber. Further, the gas feed pipe 25 is connected to the gas molecule ionization chamber. Helium as an ionized gas is supplied through the gas feed pipe 25. Here, the gas molecule ionization chamber is not necessarily composed of the independent components of the extraction electrode, the sidewall, and the top plate as shown in FIG. 2 and may be integrally composed. Further, the gas molecule ionization chamber is not necessarily cylindrical and any shape is included in the present application as long as the shape can: form a space surrounding an emitter tip; introduce an ionized gas into the interior; and apply an electric field to the emitter tip.

Figure 3A:
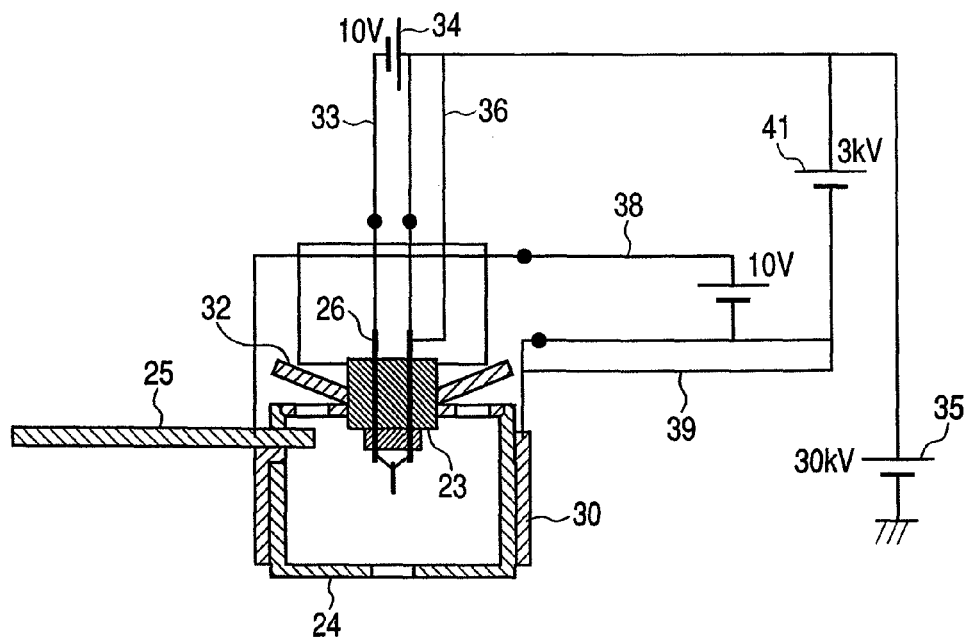
FIG. 3A is a diagrammatic illustration showing wires of a gas field ion source according to the first embodiment (during connection)
Figure 3B:
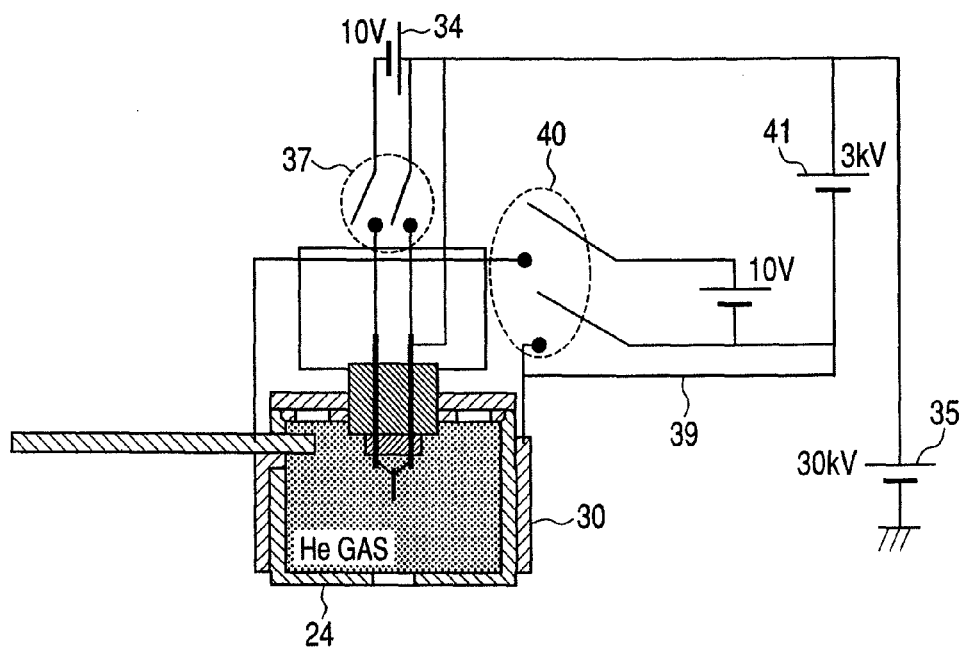
FIG. 3B is a diagrammatic illustration showing wires of a gas field ion source according to the first embodiment (during disconnection)

A diagrammatic illustration of wires in a gas field ion source according to the present embodiment is shown in FIG. 3A. Wires 33 are connected to the support bars 26 of the filament mount 23 and it is possible to feed electricity to the filament 22 from an electric power source 34 and raise the temperature of the emitter tip 21 by using the heat transferred from the filament. Further, a high voltage power supply 35 for ions is connected to the wires and it is also possible to apply accelerating voltage. As shown in FIG. 3A, the copper-made thick wires 33 and a stainless-steel-made fine wire 36 are connected to the filament 22 as the wires for electrification. Further, a cut-off mechanism is attached to the thick copper wires. A diagrammatic illustration of the wires when the wires are cut-off by the cut-off mechanism 37 is shown in FIG. 3B. A bimetal deforming in proportion to temperature is used as parts of the materials of the cut-off mechanism 37 and the copper wires are connected and disconnected by switching in accordance with the temperature change of the bimetal.

As wiring for supplying electricity to the electric resistance heater, thick copper wires 38 and a fine stainless steel wire 39 are connected in the same way as the aforementioned filament wiring and a cut-off mechanism 40 is attached to the thick copper wires. A bimetal deforming in proportion to temperature is used as parts of the materials of the cut-off mechanism and the copper wires are connected and disconnected by switching in accordance with the temperature change of the bimetal. Here, the extraction electrode 24 is electrically insulated from the emitter tip 21 and has the same potential as an end of the electric resistance heater. Hence, extraction voltage can be applied between the emitter tip 21 and the extraction electrode from an ion extraction power source 41. Further, even in the state where the copper wires are cut off, the extraction voltage can be applied to the extraction electrode 24 through the fine stainless steel wire 39.

Figure 4:
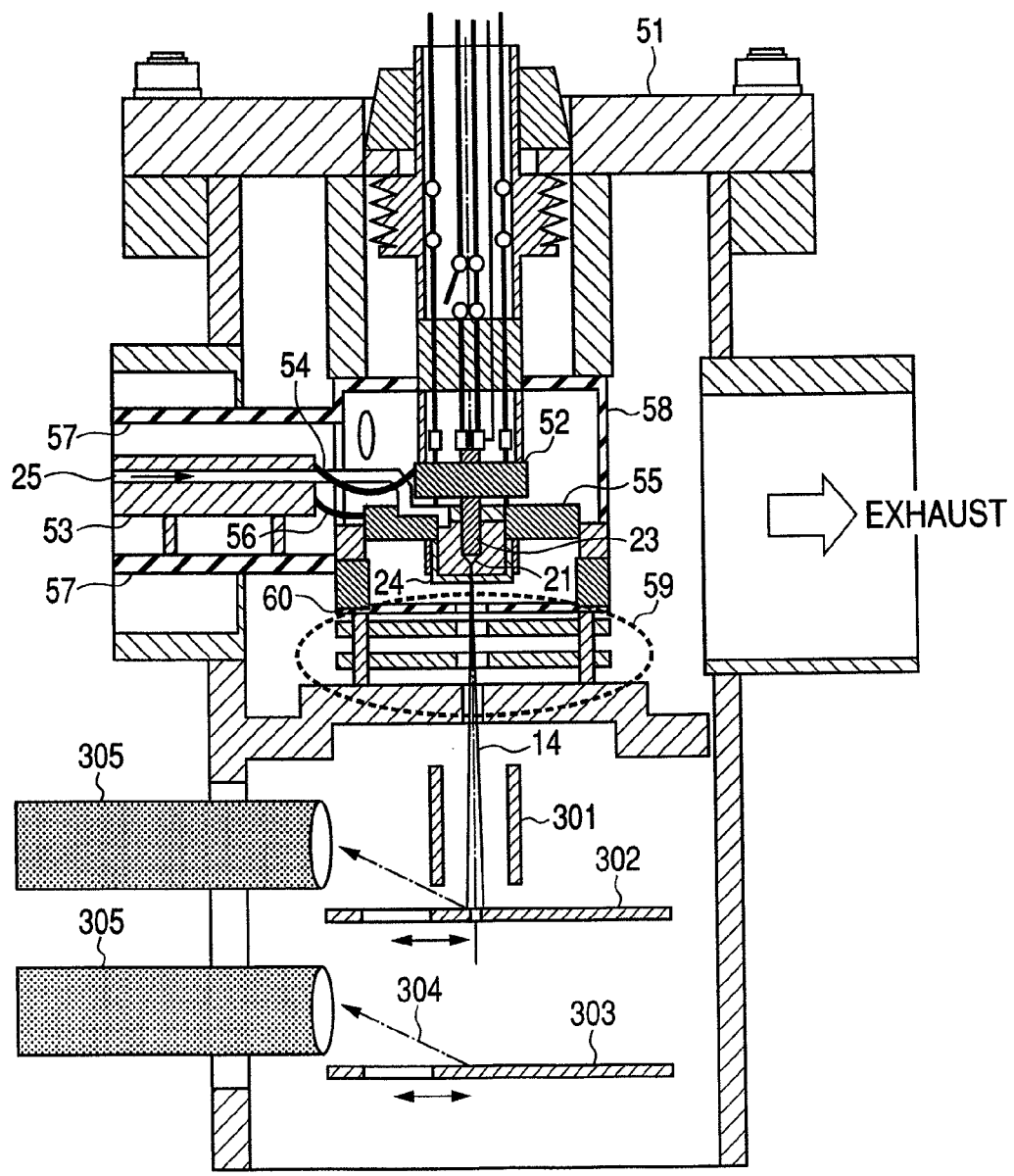
FIG. 4 is a general structural diagram of a gas field ion source according to the first embodiment.

Successively, a general structural diagram of a gas field ion source according to the present embodiment is shown in FIG. 4. An emitter tip 21 is movably structured in the manner of being suspended from an upper flange 51 so that the emitter tip 21 may be movable in the two orthogonal directions on the horizontal plane and in the vertical direction and the angle of the apex of the emitter tip 21 may be adjustable. In contrast, an extraction electrode 24 is fixed to a vacuum chamber. Further, a filament mount 23 is electrically insulated with a sapphire base 52. It is obvious that the present ion source is the vacuum chamber and, in addition to a vacuuming system, a system to transfer refrigeration from a refrigerator is installed. A refrigerator 4 is connected to the sapphire base 52 with a copper-made refrigeration conduction bar 53 that is a good thermal conductor. Since the refrigerator is fixed to the vacuum chamber however, the tip of the refrigeration conduction bar 53 is connected to the sapphire base 52 with a flexible copper stranded wire 54. By so doing, the emitter tip 21 comes to be movable and the effect of lowering the transfer of high frequency vibration of the refrigerator with the copper stranded wire 54 is obtained. That is, the effect of being able to provide an ion microscope capable of high resolution observation is obtained. From the viewpoint of lowering the transfer of vibration from the refrigerator, another sapphire base 55 to support the extraction electrode is connected to the tip of the refrigeration conduction bar 53 as a good thermal conductor also with a flexible copper stranded wire 56 (made by twisting about 1000 copper wires fifty micrometers in diameter) although the extraction electrode 24 is fixed to the vacuum chamber. By so doing, the effect of being able to provide an ion microscope capable of high resolution observation is obtained.

Figure 5:
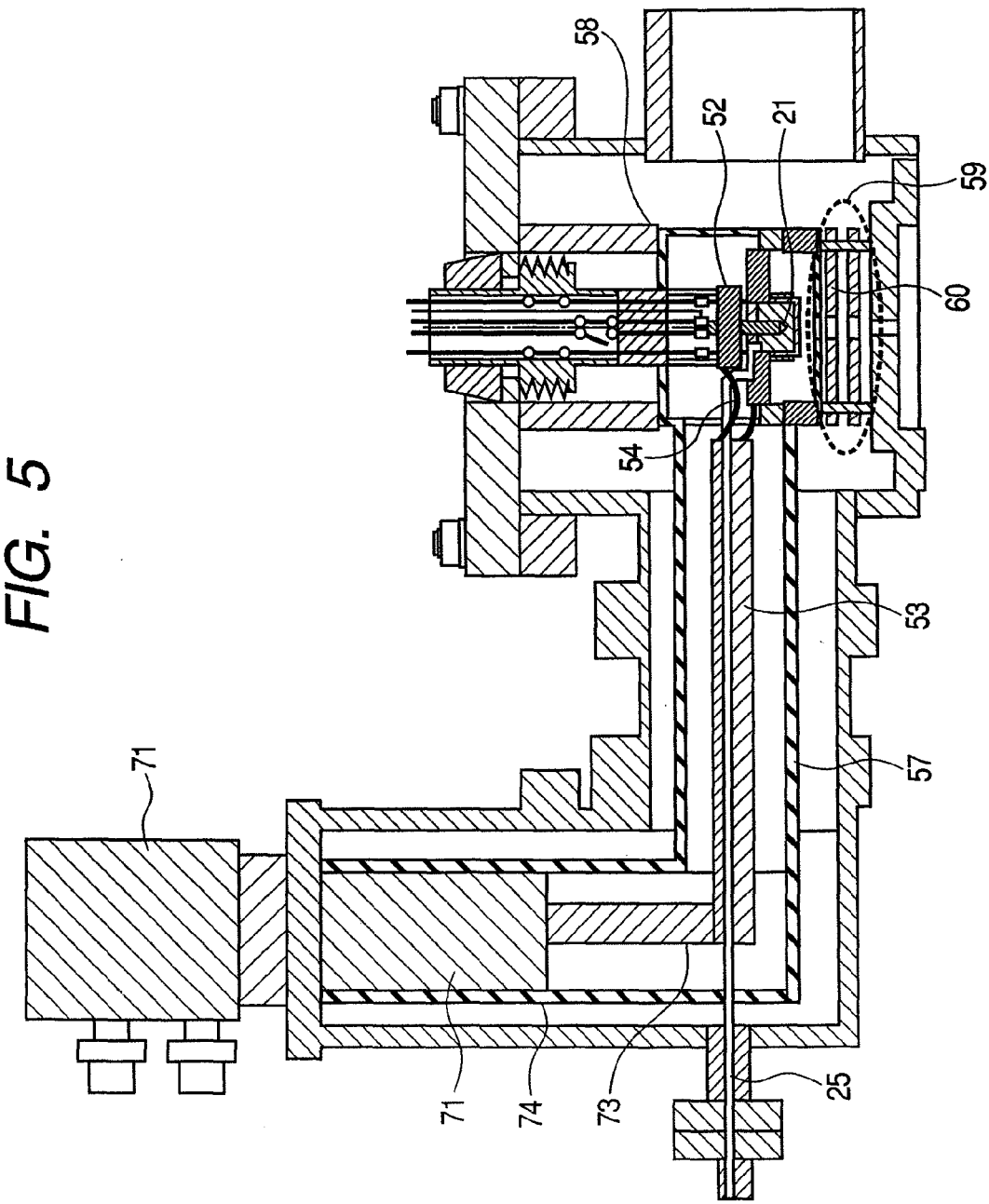
FIG. 5 is a view showing a cooling system of the present ion source according to the first embodiment.

A cooling system of the present ion source is described hereunder in reference to FIG. 5. The feature of the apparatus is that a refrigerator is installed in the transverse direction vertical to the ion beam irradiation axis of an ion microscope. By so doing, the effect of easily structuring the movable mechanism of an emitter tip can be obtained. Here, in the present embodiment, a pulse tube refrigerator 71 is used in the cooling system. The pulse tube refrigerator is a refrigerator generating a relatively small vibration and has the feature of reducing the mechanical vibration of the emitter tip to the minimum. The present pulse tube refrigerator has a first cooling stage 72 where temperature lowers to about 70 K and a second cooling stage 73 where temperature can be lowered to 5 K. The second cooling stage is covered with a shield reducing the thermal radiation (radiation shield) 74 connected to the first cooling stage 72. Then the second cooling stage is connected to the sapphire base 52 through the copper refrigeration conduction bar 53 with the flexible copper stranded wire 54 as stated above and finally cools the emitter tip 21. As stated above, in the present ion source, the mechanical vibration is reduced by using the copper stranded wire 54 for the connection.

Further, the radiation shield 74 connected to the first cooling stage of the pulse tube refrigerator is connected to a radiation shield 58 shown in FIG. 4 via a copper-made refrigeration conduction tube 57. Here, the refrigeration conduction tube 57 extends to the vicinity of the emitter tip in the manner of covering the refrigeration conduction bar 53. The radiation shield 58 surrounds a gas molecule ionization chamber including the emitter tip and reduces heat quantity flowing into the gas molecule ionization chamber by thermal radiation. Further, in FIG. 4, at least one of the electrodes of an electrostatic lens 59 being located in the ion beam extraction direction from the gas molecule ionization chamber and facing the gas molecule ionization chamber is connected to the radiation shield. In the case shown in FIG. 4, the electrostatic lens comprises three sheets of electrodes and the electrode 60 closest to the gas molecule ionization chamber is connected to the radiation shield 58 and cooled. In the refrigerator of the present embodiment, the refrigeration capacity of the first cooling stage is about 20 W and the refrigeration capacity of the second cooling stage is about 0.5 W. In the present embodiment, the radiation shield is connected to the first cooling stage having a larger refrigeration capacity and thereby the heat quantity flowing into the gas molecule ionization chamber and the emitter tip by thermal radiation is reduced. By so doing, a cryogenic temperature of the emitter tip is realized, a gas field ion source yielding an ion beam of larger electric current can be provided, and also the effect of being able to provide an ion microscope capable of high resolution observation is obtained.

Figure 6A:
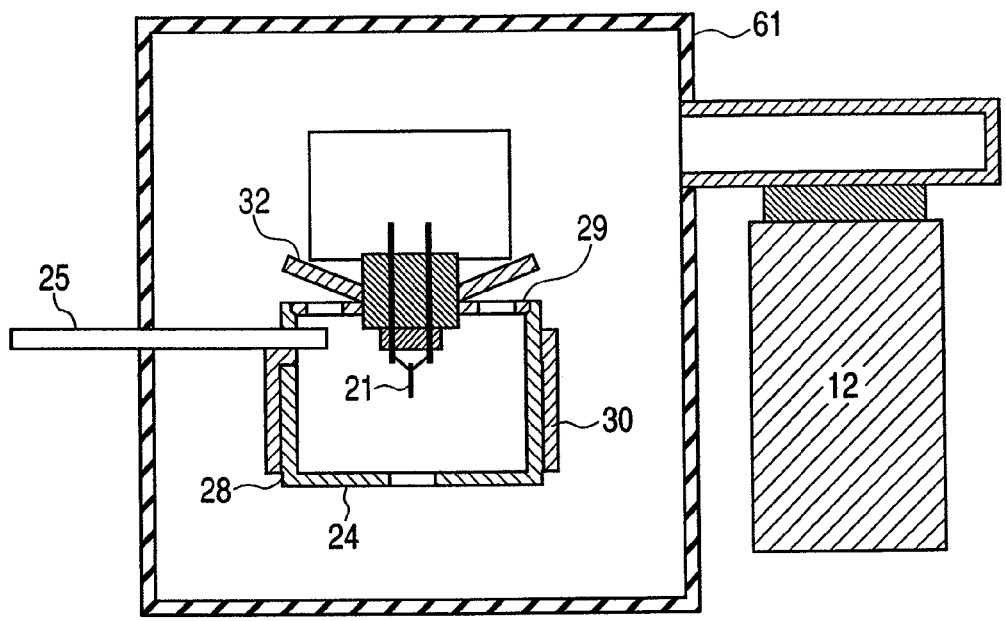
FIG. 6A is a view explaining the operations of on-off valves (open state) on a top plate of a gas molecule ionization chamber according to the first embodiment.

The operations of the present ion source are described hereunder. Firstly, the operations of on-off valves of a gas molecule ionization chamber top plate are explained in reference to FIGS. 6A and 6B. After an emitter tip 21 prepared beforehand is attached, gas is evacuated from a vacuum chamber with a vacuum pump 12. On this occasion, lids 32 of the gas molecule ionization chamber top plate are open as shown in FIG. 6A, the conductance of the vacuuming system of the gas molecule ionization chamber is larger than the case where the lids are closed, and the effect of being able to complete particularly the rough vacuuming of the gas molecule ionization chamber for a short period of time is obtained.

After the vacuuming, gas is evacuated by heating an extraction electrode 24, a sidewall 28, the top plate 29, and others with an electric resistance heater 30 outside the gas molecule ionization chamber sidewall. On this occasion, by simultaneously heating a vacuum chamber 61 with another electric resistance heater installed in the atmosphere, the degree of vacuum in the vacuum chamber improves and the concentration of residual gas lowers. By the operation, the effect of improving the time stability of ion emission current is obtained. In the present embodiment, the electric resistance heater 30 is located outside the gas molecule ionization chamber. By so doing, degassing from the electric resistance heater itself is avoided in comparison with the case where the electric resistance heater is located inside and hence the effect of being able to further improve the degree of vacuum in the gas molecule ionization chamber is obtained. Further, although the electric resistance heater is used in the present embodiment, it is also possible to install a heater lamp and subject the extraction electrode, the sidewall, and others to degassing treatment. By so doing, noncontact heating is applied and hence the effects of simplifying the structure around the extraction electrode, eliminating the necessity of applying a high voltage to wires, and simplifying the structure of the electric power source are obtained. Furthermore, it is also possible to supply a high temperature inert gas through a gas feed pipe and subject the extraction electrode, the sidewall, and others to degassing treatment. By so doing, the gas heating system can be disposed at the ground potential and hence the effects of simplifying the structure around the extraction electrode, eliminating the necessity of applying a high voltage to wires, and simplifying the structure of the electric power source are obtained.

Figure 6B:
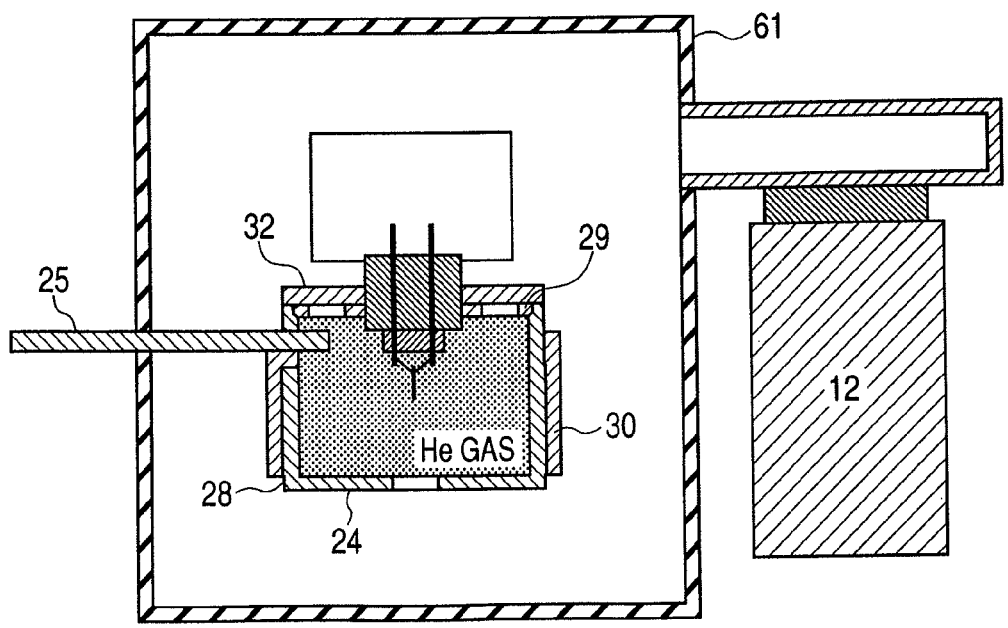
FIG. 6B is a view explaining the operations of on-off valves (closed state) on a top plate of a gas molecule ionization chamber according to the first embodiment.

Successively, the heating of the gas molecule ionization chamber and the vacuum chamber is stopped and then, after the lapse of enough time, the emitter tip, the extraction electrode, the radiation shield, and others are cooled by activating the refrigerator. Then helium as the ionization gas is introduced into the gas molecule ionization chamber through a gas feed pipe 25. On this occasion, the bimetal alloy deforms, the lids 32 of the gas molecule ionization chamber top plate are in the state of closing as shown in FIG. 6B, and the conductance of the vacuum system to the gas molecule ionization chamber reduces. As a result, it is possible to improve the degree of vacuum outside the gas molecule ionization chamber even when a helium gas is introduced abundantly into the gas molecule ionization chamber.

Successively, when voltage is applied between the emitter tip 21 and the extraction electrode 24, an intense electric field is formed at the apex of the emitter tip. Most of the helium is extracted to the emitter tip face by the intense electric field and reaches the vicinity of the apex of the emitter tip where the electric field is most intense. Helium undergoes electric field ionization there and an ion beam can be extracted trough the small aperture of the extraction electrode. Here, by adjusting the intensity of the electric field, helium ions are produced in the vicinity of one atom of the nano-pyramid top existing at the apex of the emitter tip. That is, since ions are produced in a very limited region, the present ion source is characterized in that the electric current discharged per unit area and unit solid angle can be increased. This is an important characteristic in order to obtain an ion beam of a very fine diameter and a large electric current on a sample.

When iridium or the like is vapor-deposited on tungsten in particular, the nano-pyramid structure having one atom at the apex thereof can produce ions stably. In the case where three atoms exist at the apex of tungsten <111>, the supplied helium gas is dispersed to the three atoms. Consequently, an ion source having a nano-pyramid structure of iridium wherein helium gas is intensively supplied to one atom can emit a larger electric current per unit area and unit solid angle. That is, by using an emitter tip formed by vapor-depositing iridium, platinum, rhenium, osmium, or the like on tungsten, the effect of reducing the beam diameter of an ion microscope on a sample and increasing electric current can be obtained.

Successively, an ion beam 14 having passed through the lens passes through a scanning deflection electrode 301, further passes through an aperture having a minute diameter on an aperture plate 302, and collides with a movable shutter 303. Here, by detecting secondary particles 304 such as secondary electrons generated at the movable shutter with a secondary particle detector 305 while the movable shutter is irradiated with an ion beam and obtaining a secondary particle image, an ion radiation pattern of an emitter tip can be observed. Then the position and the angle of the emitter tip are adjusted while the ion radiation pattern is observed. It is also possible to adjust an ion beam track or an aperture position so that the ion beam coming from one atom in the ion radiation pattern may pass through the aperture. When the apex of the pyramid has three or six atoms, it is also possible to adjust an ion beam track or an aperture position so as to select ions emitted from the vicinity of any one of the atoms and pass through the aperture. Here, also by detecting secondary particles such as secondary electrons emitted from the aperture plate 302 with the secondary particle detector and obtaining a secondary particle image, the similar effects can be obtained. By forming very fine protrusions on the movable shutter and observing the secondary particle image of the protrusions in particular, the pattern can be observed more clearly. It goes without saying that, after the adjustment, the shutter 303 is moved and the ion beam is allowed to pass through.

Further, in the present ion source, since the degree of vacuum is high outside the gas molecule ionization chamber and thus an ion beam is less likely to collide with gas in vacuum and to be neutralized as stated above, the effect of being able to irradiate a sample with an ion beam of a large electric current is obtained. Furthermore, the number of high temperature helium gas molecules colliding with the extraction electrode reduces, the cooling temperatures of the emitter tip and the extraction electrode can be lowered, and the effect of being able to irradiate a sample with an ion beam of a large electric current is obtained.

Here, when a nano-pyramid is damaged by an accidental emission phenomenon or the like, it is possible to reproduce the nano-pyramid easily by heating the emitter tip for about 30 minutes (at about 1,000° C.)

Here, an on-off valve in the present embodiment has the advantage that the on-off valve can be closed and opened automatically by the cooling of the ion source even without another mechanical structure. In particular, the on-off valve is characterized by being able to have a simple structure so as to be suitable for high voltage application.

Further, when an ion beam is extracted, the copper wires of the filament and the copper wires of the electric resistance heater are disconnected as shown in FIG. 3B. This is because a bimetal that deforms by temperature is used for parts of the materials used for the disconnection of the wires and the wires are automatically disconnected by cooling the ion source. Here, voltage is applied to each of them through stainless steel wires. By so doing, heat inflow from copper wires is avoided and the cooling temperatures of the emitter tip and the extraction electrode can be lowered. That is, the effects of enhancing the brightness of the ion source and increasing the electric current of an ion beam are obtained. Thereby the effects of being able to provide: a gas field ion source that can yield an ion beam of a large electric current; and an ion microscope capable of high resolution observation are obtained.

Operations of an ion beam irradiation system are hereunder described in reference to FIG. 1. The operations of the ion beam irradiation system are controlled by the command from a computer 99. Firstly, an ion beam 14 emitted from the apex of the emitter tip of an ion source is focused on a sample 9 on a sample stage 10 with an object lens 8 through a condenser lens 5 and a beam limiting aperture 6. By so doing, a minute spot beam can be obtained on the sample. On this occasion, the electric current is as small as about several pA but the beam diameter can be reduced to 1 nm or less. The sample is scanned with the minute ion beam emitted from an ion beam scanning electrode 7, thereby secondary particles such as secondary electrons emitted from the sample are detected with a secondary particle detector 11, and a scanned ion microscopic image can be obtained on a image display means of the computer 99 by brightness modulation. Consequently, high resolution observation of a sample surface is realized.

Here, the present ion source is characterized by using ions emitted from the vicinity of one atom at the apex of the nano-pyramid. That is, the region of ion emission is small and an ion light source is as small as one nanometer or less. Consequently, by focusing the ion light source on a sample at the same magnification or changing the reduction ratio into about half, it is possible to make the most of the characteristic of the ion source. It is estimated that the size of the light source of a conventional gallium liquid metal ion source is about 50 nm and, in order to realize a beam diameter of 5 nm on a sample, the reduction ratio is reduced to at most one tenth or less. On this occasion, the vibration of the emitter tip in the ion source is reduced to one tenth or less on a sample. For example, even though the emitter tip vibrates at 10 nm, the vibration is 1 nm or less on a sample and the influence on the beam diameter of 5 nm is trifle. On the other hand, in the ion source according to the present embodiment, vibration of 10 nm comes to be vibration of 5 nm on a sample with the reduction ratio of half and the vibration is large enough in comparison with the beam diameter. Consequently, this has not been sufficiently taken into consideration in a conventional apparatus and good observation of a sample surface has not always been realized. In the present embodiment, measures against such vibration are sufficiently taken and hence the effect of realizing high resolution observation of a sample surface sufficiently exhibiting the performance of the ion source is obtained.

Here, although the extraction electrode in the present gas field ion source is fixed to the vacuum chamber, the emitter tip mount is connected with a copper stranded wire and thereby the emitter tip can move from the extraction electrode. It goes without saying that thereby the effects of being able to: adjust the position of the emitter tip to the small aperture of the extraction electrode and the axis of the emitter tip to the optical system; and form a finer beam are obtained.

Further, the pulse tube refrigerator may also be either a GM type or a Stirling type. Furthermore, although explanations have been made on the basis of a refrigerator having two cooling stages in the present embodiment, a refrigerator having single cooling stage may also be adopted and the present invention is not limited by the number of the cooling stages.

Consequently, in the present embodiment, it is possible to provide a gas field ion source that can: simultaneously increase a conductance during rough vacuuming and reduce an extraction electrode aperture diameter from the viewpoint of the increase of ion current; and obtain an ion beam of a large electric current.

Further, it is possible to provide a gas field ion source that can: realize a higher degree of vacuum in a gas molecule ionization chamber; and emit highly stable ions.

Furthermore, it is possible to provide a gas field ion source that can: realize a cryogenic temperature of an emitter; and obtain an ion beam of a large electric current. Yet further, it is possible to provide a gas field ion source and an ion microscope that can: realize the reduction of mechanical vibration; and secure high resolution observation.

Second Embodiment

Although a pulse tube refrigerator having relatively low vibration is used in the first embodiment, it sometimes happens that the pulse tube refrigerator is not satisfactory for minimizing the diameter of an ion beam. In the second embodiment, a refrigerator combining a GM type refrigerator and a helium gas pot is used in place of the pulse tube refrigerator.

The GM type refrigerator has a first cooling stage where temperature lowers to about 50 K and a second cooling stage where temperature can be lowered to 4 K. Those cooling stages are covered with a sealed type pot. Then the pot is filled with helium gas. That is, the GM type refrigerator cools helium gas and the helium gas cools the outer wall of the pot. By the cooling system, the tip of the pot is cooled to about 6 K and the vicinity of the first cooling stage is cooled to about 70 K. In the present refrigeration system, even though the GM type refrigerator vibrates, the mechanical vibration is transferred in an attenuated state since the helium gas exists in between. That is, the effect of lowering the mechanical vibration of the helium gas pot to a level lower than the mechanical vibration of the GM type refrigerator is obtained. The helium gas pot: is connected to the emitter tip mount with a copper stranded wire via the copper refrigeration conduction bar as stated in the first embodiment; and cools the emitter tip. As stated in the first embodiment, the mechanical vibration further lowers by using the copper stranded wire for the connection. A gas field ion source using the present cooling system is characterized by being able to further reduce the mechanical vibration of the emitter tip.

Consequently, in the present embodiment, it is possible to provide a gas field ion source and an ion microscope that can: realize the reduction of mechanical vibration; and secure high resolution observation.

Third Embodiment

A refrigerator is used in the first and second embodiments. However, a refrigerator essentially yields mechanical vibration and is likely to transfer the vibration to an emitter tip. In a charged particle microscope, the vibration of the emitter tip causes an irradiation beam spot on a sample to vibrate and the resolution of the microscope to deteriorate. In the third embodiment, solid nitrogen (the solidification temperature in vacuum is about 51 K) is used as the coolant.

Figure 7:
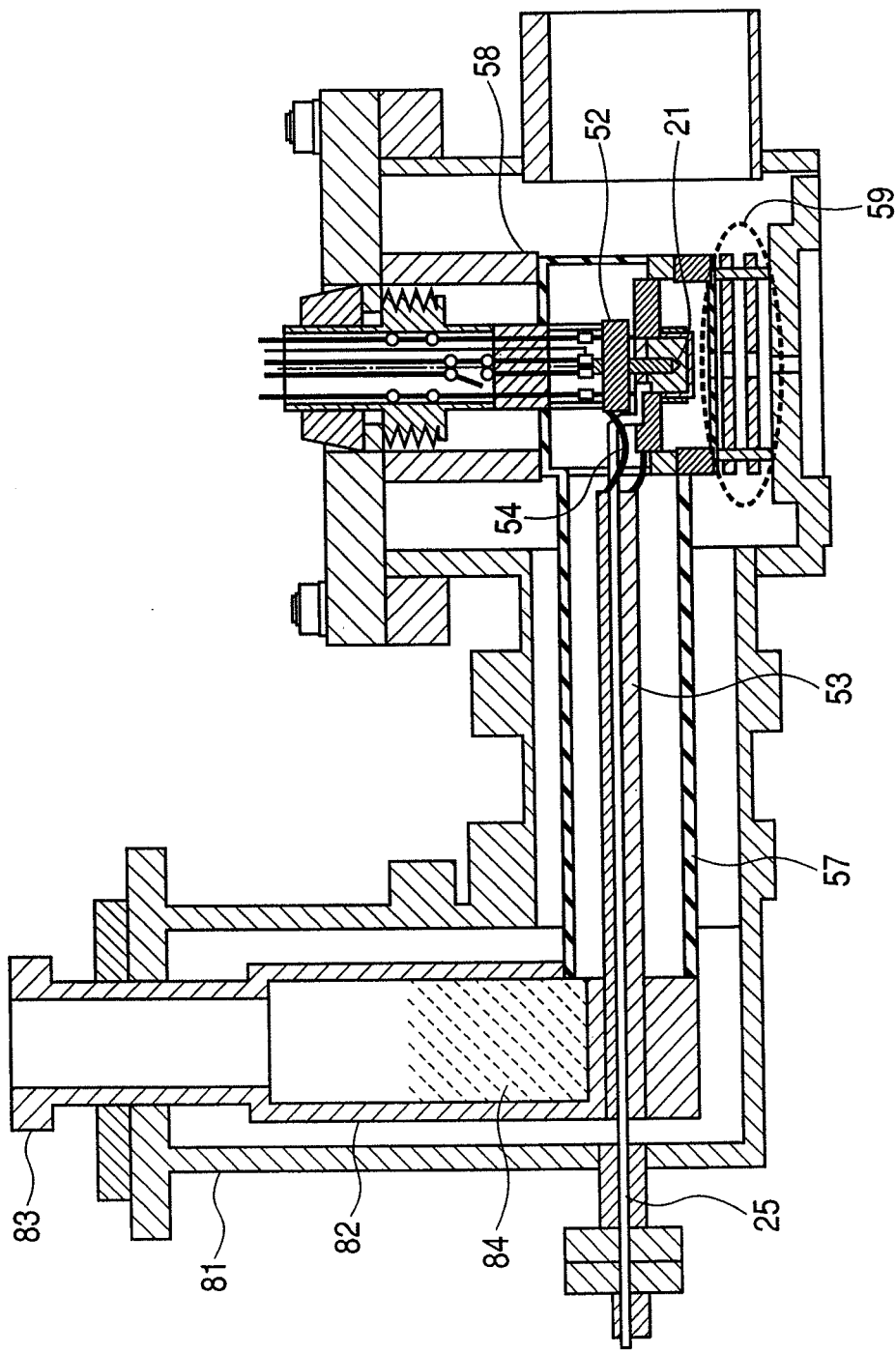
FIG. 7 is a configuration diagram of a gas field ion source according to the third embodiment.

A configuration diagram of a gas field ion source according to the present embodiment is shown in FIG. 7. In the present ion source, a solid nitrogen chamber is installed at the place where a refrigerator is installed in the case of the first embodiment. The solid nitrogen chamber 81 is a vacuum chamber and contains a solid nitrogen tank 82 therein. A copper conduction bar 53 is connected to the solid nitrogen tank 82 in the same way as the first embodiment. In the present ion source, a radiation shield 57 stated in the first embodiment is also connected to the solid nitrogen tank 82. Liquid nitrogen is firstly introduced into the solid nitrogen tank 82 and thereafter the interior of the solid nitrogen tank is vacuumed through a vacuuming port 83. By so doing, the liquid nitrogen is solidified and turns to be solid nitrogen 84. The solid nitrogen in a vacuuming environment sublimates by the heat inflow from an emitter tip, an extraction electrode, and the radiation shield and cools them. In the cooling method, vibration caused by the foaming formed when liquid nitrogen boils does not appear. That is, by an ion source according to the present embodiment, it is possible to provide a gas field ion source and an ion microscope that can: realize the reduction of mechanical vibration; and secure high resolution observation.

Figure 8:
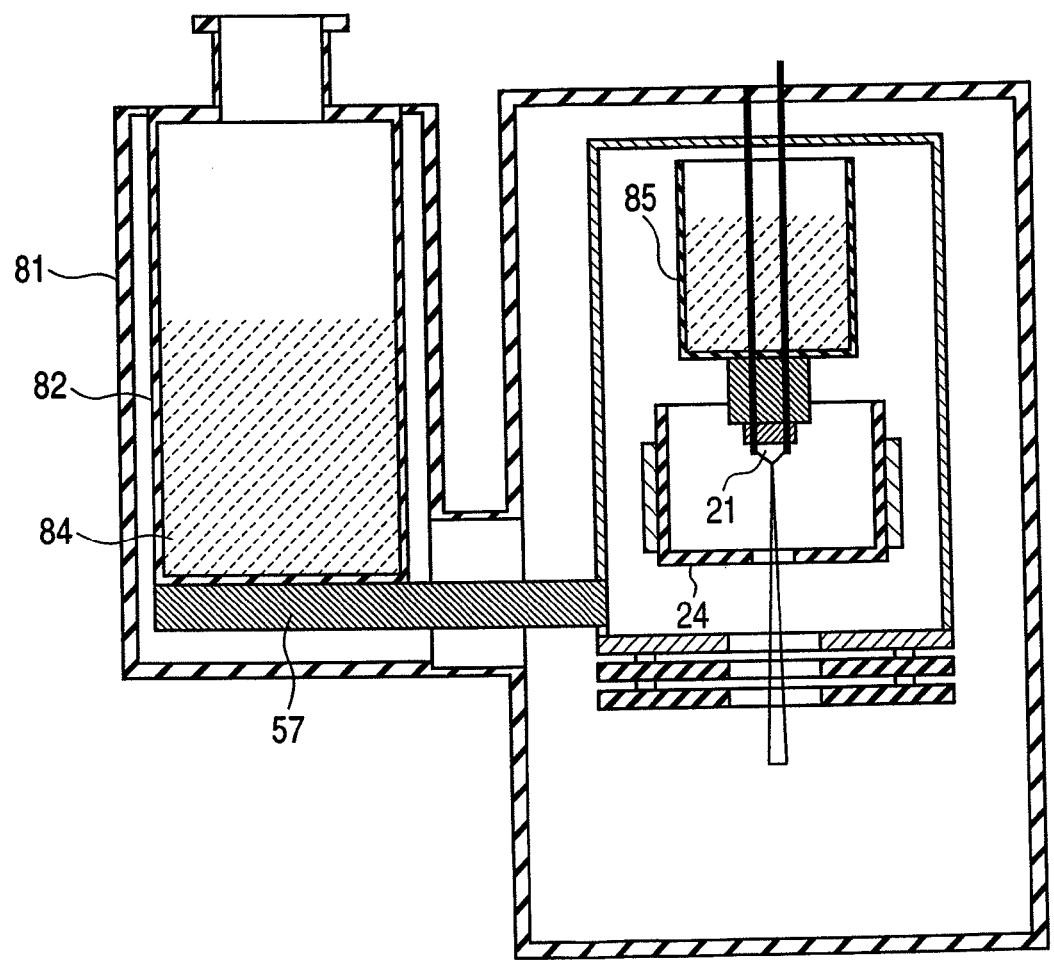
FIG. 8 is a schematic configuration diagram of a gas field ion source according to the third embodiment.

The case wherein solid nitrogen is adopted as the coolant of a radiation shield and liquid helium is used as the coolant of an emitter tip is hereunder described. A schematic configuration diagram of a gas field ion source according to the present embodiment is shown in FIG. 8. In the present ion source, an emitter tip 21 is directly connected to a liquid helium tank 85 and cooled. Then the solid nitrogen 84 shields the emitter tip 21, a gas molecule ionization chamber, and the liquid helium tank 85 from radiation. A copper conduction bar 57 is connected to a solid nitrogen tank 82 in the same way as the above case. The production method of the solid nitrogen is the same as the method described above. In the present embodiment, the solid nitrogen cools the radiation shield and vibration caused by foaming does not appear likewise. Further, the liquid helium is connected to a liquid helium dewar with a transfer tube (not shown in the figures) and the vibration is minimized. That is, by an ion source according to the present embodiment, it is possible to provide a gas field ion source and an ion microscope that can: realize the reduction of mechanical vibration; and secure high resolution observation.

Further, it is also possible to: install a refrigerator in the solid nitrogen tank in order to cool solid nitrogen; and stop the operation of the refrigerator only during observation requiring a high resolution. On this occasion, the effect of being able to reduce the consumption of the solid nitrogen is obtained. The effect of being able to maintain the tip at a low temperature by latent heat accompanying the melting or vaporizing of the solid nitrogen even when the operation of the refrigerator is stopped is obtained. That is, by an ion source according to the present embodiment, it is possible to provide a gas field ion source and an ion microscope that can: realize the reduction of mechanical vibration; and secure high resolution observation.

Here, although nitrogen is used in the present embodiment, neon, oxygen, argon, methane, hydrogen, and others can be used. When solid neon is used in particular, the effect of being able to realize a low temperature suitable for increasing the electric current of a helium ion beam is obtained.

Fourth Embodiment

Figure 9:
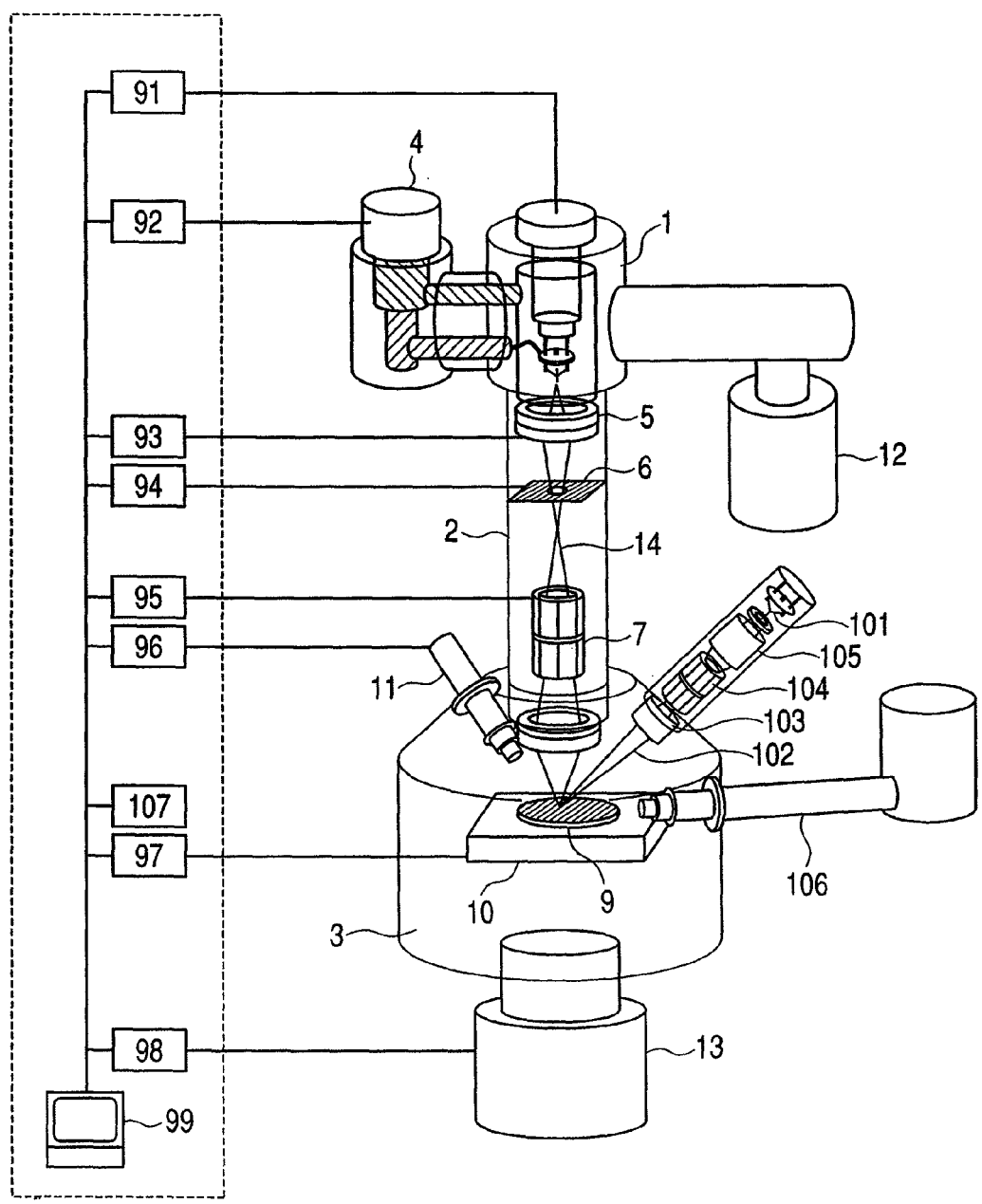
FIG. 9 is a configuration diagram of a composite apparatus comprising an ion beam microscope and an electron beam microscope according to the fourth embodiment.
Figure 10A:
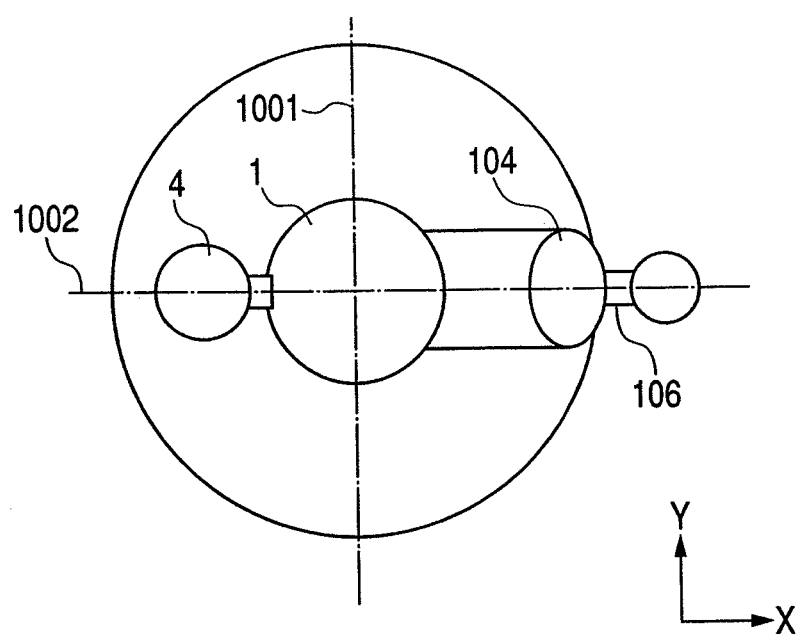
FIG. 10A is a configuration diagram of a composite apparatus comprising an ion beam microscope and an electron beam microscope according to the fourth embodiment.
Figure 10B:
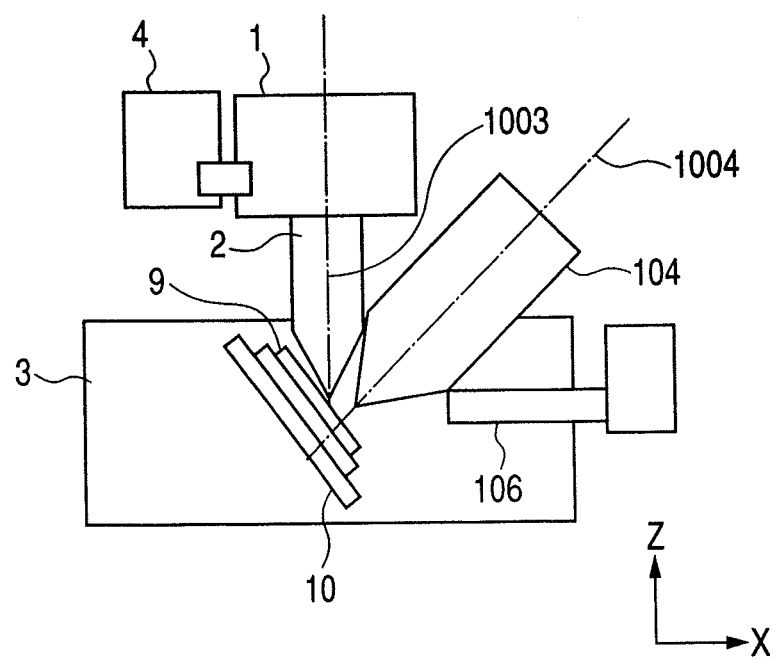
FIG. 10B is a configuration diagram of a composite apparatus comprising an ion beam microscope and an electron beam microscope according to the fourth embodiment.

A configuration diagram of a composite apparatus comprising an ion beam microscope and an electron beam microscope according to the fourth embodiment is shown in FIG. 9. Further, a top view of the configuration of the composite apparatus comprising the ion beam microscope and the electron beam microscope according to the present embodiment is shown in FIG. 10A. Likewise, the side view thereof is shown in FIG. 10B.

The configuration and the operations of the ion beam microscope are nearly identical to the first embodiment. In the present apparatus, a scanning electron microscope is attached to a vacuum sample chamber. The scanning electron microscope comprises an electron gun 101, lenses for electron beam 103, an electron beam scanning deflector 104, an electron beam column 105 to store the components, and others.

In a vacuum sample chamber 3, a sample stage 10 on which a sample 9 is mounted, a secondary particle detector 11, and an X-ray detector 106 are installed. The sample stage has an inclining function and it is also possible to adjust the sample surface so as to be vertical to an electron beam 102. By the present apparatus, a nearly identical place of a sample can be irradiated with both a helium or hydrogen ion beam and an electron beam.

Operation procedure of a scanning electron microscope is explained hereunder. An electron beam 102 discharged from the electron gun 101 is focused with the lenses for electron beam 103 and the sample 9 is irradiated with the electron beam 102. On this occasion, it is possible to observe the sample by: irradiating a cross section of the sample with the electron beam 102 while scanning with the electron beam scanning deflector 104; detecting secondary electrons emitted from the sample cross section with the secondary particle detector 11; and converting the intensity into the brightness of an image. The place of the electron beam irradiation is adjusted beforehand so as to be identical to the place of ion beam irradiation. This can be done by: firstly memorizing an ion microscopic image in a computer 99; and secondly adjusting a DC bias current to control the electron beam scanning deflector 104 so that a feature point in the memorized ion microscopic image and the same feature point observed in a scanning electron microscopic image may be displayed at an identical place while observing the scanning electron microscopic image. Otherwise, this can be done by adjusting a DC control voltage of a scanning deflection electrode 7 in an ion microscope while observing the sample again with the ion microscope. Although the scanning deflector is used in order to conform the electron beam irradiation place to the ion beam irradiation place here, it is also possible to use another deflector for the adjustment. On this occasion, since only the DC component is controlled in the deflection control of the deflector, the effect of facilitating the production of an electric power source having a lower noise than the electric power source of the scanning deflector to control AC is obtained.

By so doing, it is possible to obtain both a helium ion beam scanning secondary electron image and an electron beam scanning secondary electron image of a sample without the transfer of the sample stage 10. Both the images are displayed on an image display means in the controller 99. Both the images have nearly identical information but, since the second electron yield caused by ion beam excitation is different from the second electron yield caused by electron beam excitation, more precisely different kinds of information are obtained and more detailed analysis of a sample becomes possible.

The present apparatus is, as shown in FIG. 10B, characterized in that the ion beam irradiation axis 1003 of the ion microscope is nearly vertical to the installation plane of the apparatus, namely to the X-Y plane in FIG. 10A and the electron beam irradiation axis 1004 is directed to a direction inclining to the installation plane of the apparatus. This is related to the aforementioned characteristic of the ion microscope. That is, the present ion source is characterized by using ions emitted from the vicinity of one atom at the apex of a nano-pyramid. That is, the region of ion emission is small and the ion light source is as small as one nanometer or less.

Consequently, by focusing the ion light source on a sample at the same magnification or changing the reduction ratio into about half, it is possible to make the most of the characteristic of the ion source.

Problems to be solved in order to take advantage of the characteristic of the present ion microscope that allows high resolution observation are the vibration of a sample and the vibration of a gas field ion source and an ion microscope column.

As a result of vibration simulation and experimental evaluation, it has been found that high resolution observation is obtained when the ion beam irradiation axis of the ion microscope is nearly vertical to the installation plane of the apparatus and a sample is horizontally mounted. In particular, it has been found that the inclining electron gun has a larger vibration than the ion source and also that, in the scanning electron microscope, the reduction ratio when the diameter of the electron light source is focused on a sample is smaller than the case of the ion microscope and the influence of the vibration of the electron gun is smaller than the case of the ion microscope. Those are the problems newly arising because of the ion microscope that uses an ion beam emitted from one atom at the apex of a nano-pyramid like the present apparatus and can obtain a resolution of 1 nm or less. Since sufficient measures against the vibration are taken in the present embodiment, the effect of realizing high resolution observation of a sample surface while sufficiently exhibiting the performance of the ion source is obtained.

Further, it is possible to carry out elemental analysis on a sample surface by detecting an X-ray emitted from a sample with an X-ray detector 106. In the case of an ion microscope in particular, an X-ray is scarcely emitted when the accelerating voltage of ions is several tens kV and elemental analysis has been difficult. By the present apparatus, the effect of making it possible to simultaneously attain both ultra-high resolution observation and elemental analysis with an ion beam is obtained. In particular, by nearly simultaneously displaying arbitrary two images out of a helium ion beam scanning secondary electron image, an electron beam scanning secondary electron image, and an X-ray analysis image on the image display means of the controller 99, more detailed analysis of a sample becomes possible.

Further, the present apparatus is characterized in that the place of the X-ray detector installation in the vacuum sample chamber is maintained on the side of the electron beam irradiation column installation, namely on the right side of the center line 1001 in FIG. 10A when a vacuum sample chamber is divided into half to the electron beam irradiation column installation side and to the other side of the center of the ion beam irradiation column installation, namely when the vacuum sample chamber is divided into half by the center line 1001 of the sample chamber in FIG. 10A. By employing such installation arrangement, the effect of enabling X-ray analysis even when the sample stage is inclined toward the electron beam column side and a sample is vertically irradiated with an electron beam and observed is obtained.

Here, although the electron beam irradiation column and the irradiation column of the ion microscope are allocated so as to be able to irradiate nearly identical place of a sample with a helium or hydrogen ion beam and an electron beam in the present embodiment, by allocating the ion beam irradiation axis of the ion microscope and the electron beam irradiation axis apart from each other so as not to intersect with each other on the sample, the effects that mechanical interference between the object lenses of both the microscopes is avoided, thus the lenses can come close to the sample, and the resolutions of both the microscopes can improve are obtained.

The present apparatus is characterized in that: a refrigerator is installed in the transverse direction vertical to the ion beam irradiation axis of an ion microscope; and the side where the refrigerator is installed is the side other than the right side of the center axis 1001 on the center axis 1002 formed by projecting the irradiation axis 1004 of the electron microscope on the X-Y plane in FIG. 10A. That is, the refrigerator is not installed on the right side of the center axis 1001 on the center axis 1002 in FIG. 10A. It is most desirable to install the refrigerator on the opposite side, namely on the left side, as shown in FIG. 10A. This is an outcome obtained as a result of vibration simulation and experimental evaluation in consideration of the influence of the vibration of the refrigerator on the resolution of the scanning electron microscope and this is because it has been found that the observation resolution of the scanning electron microscope is influenced by vibration and deteriorates when the refrigerator is installed on the right side of the center axis 1001 on the center axis 1002 formed by projecting the irradiation axis 1004 of the scanning electron microscope on the X-Y plane in FIG. 10A.

Consequently, in the present embodiment, it is possible to provide: an apparatus capable of sample observation with an ion microscope and sample observation and elemental analysis with an electron microscope in the single apparatus; an analyzer suitable for observing and analyzing defects and foreign matters; and a detector.

Fifth Embodiment

Figure 11:
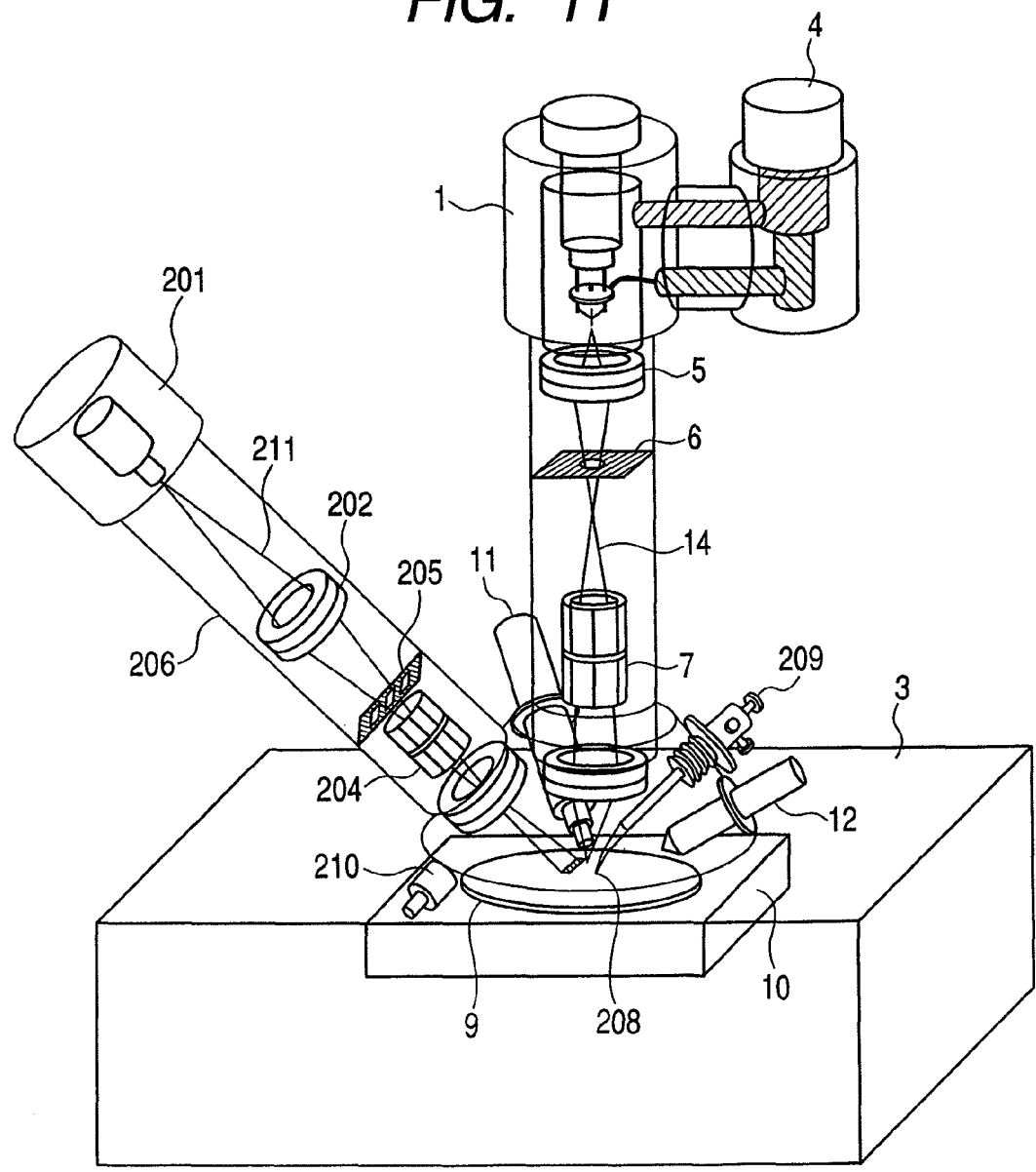
FIG. 11 is a configuration diagram of a composite apparatus comprising an ion beam microscope and an ion beam processor according to the fifth embodiment.
Figure 12A:
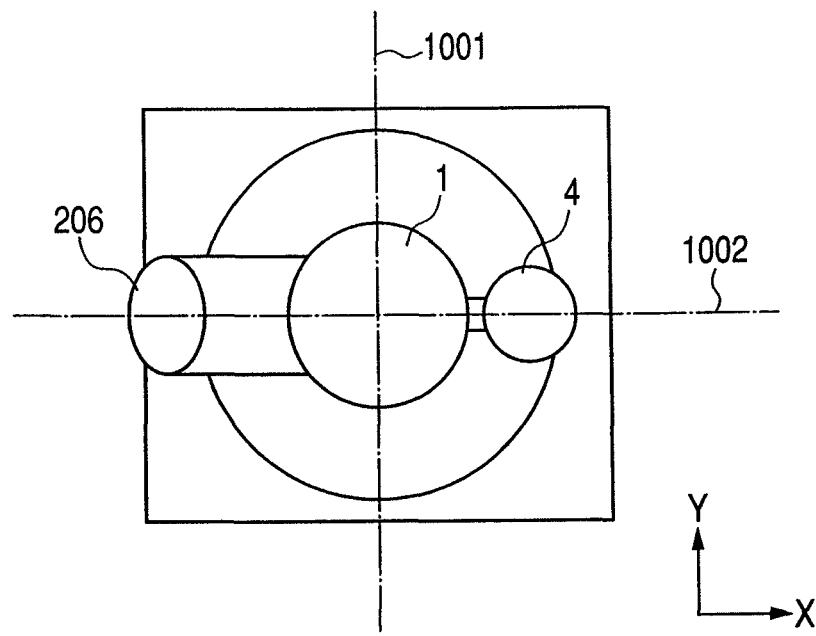
FIG. 12A is a configuration diagram of a composite apparatus comprising an ion beam microscope and an ion beam processor according to the fifth embodiment.
Figure 12B:
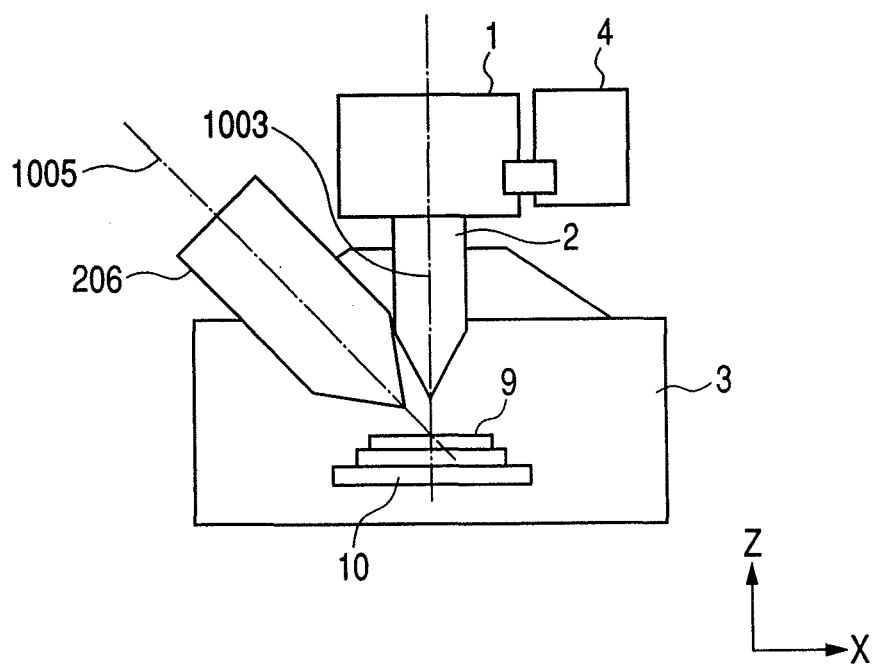
FIG. 12B is a configuration diagram of a composite apparatus comprising an ion beam microscope and an ion beam processor according to the fifth embodiment.

A configuration of a composite apparatus comprising an ion beam microscope and an ion beam processor according to the fifth embodiment is shown in FIG. 11. Further, a top view of the configuration of the composite apparatus comprising the ion beam microscope and the ion beam processor according to the present embodiment is shown in FIG. 12A. Likewise, the side view thereof is shown in FIG. 12B.

The configuration and the operations of the present ion beam microscope are almost the same as those of the first embodiment. Here, the present embodiment is characterized by the allocation of a refrigerator 4 and the refrigerator 4 is installed in the transverse direction vertical to the ion beam irradiation axis 1003 of the ion microscope as shown in FIG. 12B. Successively, the ion beam processor combined with the ion beam microscope comprises a liquid metal ion source 201 to discharge gallium, a condenser lens 202, an object lens 203, an ion beam scanning deflector 204, a stencil mask 205, a processing ion beam irradiation column 206 containing those components, and others. A vacuum sample chamber 3 is installed at the under part of the ion microscope column and the processing ion beam irradiation column, and a first sample stage 10 on which a sample 9 is mounted, a secondary particle detector 11, a precursor gas dispenser 207, and others are contained in the vacuum sample chamber. Further, the present apparatus is equipped with a probe 208 to transfer a sample chip extracted from a sample on the first sample stage by ion beam processing, a manipulator 209 to drive the probe, and a second sample stage 210 on which the fine sample chip is mounted. In the present embodiment, the gallium ion beam irradiation column and the helium or hydrogen ion beam irradiation column are allocated so as to be able to irradiate nearly identical positions on a sample with a helium or hydrogen ion beam and a gallium ion beam. Here, it goes without saying that the interior of the ion beam irradiation column 206 is also maintained in the state of vacuum.

Here, the second sample stage 210 has an inclination function of changing the irradiation angle of an ion beam to a sample chip by rotating around an inclining axis. Further, the second sample stage 210 is placed on the first sample stage 10 and hence rectilinear movement in two orthogonal directions on the first sample table, rectilinear movement in the direction vertical to the sample table, and rotating movement on the sample table are obtained by moving and rotating the first sample stage 10.

Operations of the present apparatus are hereunder described. Firstly, a gallium ion beam 211 is extracted from the liquid metal ion source 201. Then the ion beam is focused in the vicinity of the center of the object lens with the condenser lens 202. Then the ion beam passes through the stencil mask 205 having rectangular apertures. The object lens 203 is controlled on condition that the stencil mask 205 is projected on a sample. By so doing, the sample is irradiated with a rectangularly formed ion beam. When the sample is continuously irradiated with the formed ion beam, rectangular holes are formed in the sample.

In the present apparatus, the observation function of the ion microscope is also used for: observing the cross sections of defects and foreign matters on the sample; and observing a cross section of a membrane sample for an electron microscope and knowing the end of processing.

The present apparatus makes it possible to: extract a fine sample chip from a sample with the ion beam processor; fix the fine sample chip to a probe; and mount it on the second stage with the manipulator. The fine sample chip can be observed with the ion microscope. That is, the effect of being able to observe the structure of the interior of the sample in the single apparatus at a higher resolution than the conventional observation that uses an electron beam is obtained.

In particular, a problem of a conventional electron beam scanning microscope has been that the magnetic field of the lenses for electron beam separates the isotope of gallium by mass and hence the track of the gallium ion beam is separated into two tracks. Consequently, a problem with a conventional FIB-SEM apparatus has been that processing of gallium is not applied with a high degree of accuracy or that an SIM image formed by a gallium ion beam becomes double. The ion microscope of the present embodiment: uses not a magnetic field lens but an electrostatic type lens; hence solves such a problem; and thus has the effect of being able to process with a high degree of accuracy and observe a high resolution image.

Here, although secondary electrons are detected by the scanning of an ion beam in the ion microscope in the above embodiment, it is also possible to detect ions permeating a membrane sample. Further, by detecting secondary electrons emitted from the bottom surface of a membrane, it is possible to observe the bottom surface of a sample.

The present apparatus is, as shown in FIG. 12B, characterized in that the ion beam irradiation axis 1003 of an ion microscope is nearly vertical to the installation plane of the apparatus, namely to the X-Y plane in FIG. 12A and the ion beam irradiation axis 1005 of a gallium focused ion beam is directed to a direction inclining to the installation plane of the apparatus. Because of that, the vibration of the sample and the vibration of the gas field ion source and the ion beam irradiation column of the ion microscope are the problem required to be solved for making use of the feature of high resolution in the ion microscope. That is, the present ion source is characterized by using ions emitted from the vicinity of one atom at the apex of a nano-pyramid. That is, the region where ions are emitted is small and the ion light source is as small as a nanometer or less. As a result, by focusing an ion light source on a sample at the same magnification or changing the reduction ratio to about half, the characteristic of the ion source can be utilized to the maximum.

A problem to be solved in order to take advantage of the characteristic of the present ion microscope that allows high resolution observation is the vibration of a sample and the vibration of a gas field ion source and an ion microscope column.

As a result of vibration simulation and experimental evaluation, it has been found that high resolution observation is obtained when the ion beam irradiation axis of the ion microscope is nearly vertical to the installation plane of the apparatus and a sample is horizontally mounted. In particular, it has been found that the inclining gallium liquid metal ion source has a larger vibration than the gas field ion source and also that, in the gallium liquid metal ion source as stated above, the reduction ratio when the diameter of the ion light source is focused on a sample is smaller than the case of the ion microscope and the influence of the vibration of the gallium liquid metal ion source is smaller than the case of the ion microscope. Those are the problems newly arising because of the ion microscope that uses an ion beam emitted from one atom at the apex of a nano-pyramid like the present apparatus and can obtain a resolution of 1 nm or less. In the present invention however, measures against the vibration are sufficiently taken and hence the effect of realizing high resolution observation of a sample surface while sufficiently exhibiting the performance of the ion source is obtained.

The present apparatus is characterized in that: a refrigerator is installed in the transverse direction vertical to the ion beam irradiation axis of an ion microscope; and the side where the refrigerator is installed is the side other than the left side of the center axis 1001 on the center axis 1002 formed by projecting the gallium focused ion beam irradiation axis 1005 on the X-Y plane in FIG. 12A. That is, the refrigerator is not installed on the left side of the center axis 1001 on the center axis 1002 in FIG. 12A. It is most desirable to install the refrigerator on the opposite side, namely on the right side, as shown in FIG. 12A. This is an outcome obtained as a result of vibration simulation and experimental evaluation in consideration of the influence of the vibration of the refrigerator on the resolution of the gallium focused ion beam processor and this is because it has been found that the accuracy of the gallium focused ion beam processing is influenced by vibration and deteriorates when the refrigerator is installed on the left side of the center axis 1001 on the center axis 1002 formed by projecting the gallium focused ion beam irradiation axis 1005 on the X-Y plane in FIG. 12A.

Here, although a gallium liquid metal ion source is used in the present embodiment, a plasma ion source to generate gas ions such as an inert gas including argon or xenon, oxygen, or nitrogen may also be adopted. In that case, the effect of avoiding the contamination of a sample by gallium is obtained.

Further, it has been found that, in an ion beam processor to fill a hole formed after irradiating a silicon wafer with a gas ion beam and extracting a minute sample by irradiating the hole with another gas ion beam while a deposition gas is introduced, it is possible to flattening the surface of the hole by measuring the three-dimensional shape of the surface formed by the deposition with an ion beam of an ion microscope and controlling an inert gas ion beam on the basis of the measurement result. That is, the effect that production is not adversely affected even if a processed silicon wafer is returned to a process for a semiconductor device is obtained. On this occasion, an ion beam of an ion microscope is not necessarily required but an electron beam of an electron microscope also exhibits similar effect. With regard to a method for measuring a three dimensional shape, the three dimensional shape can be measured by the parallax difference of two images obtained by irradiating a sample with an ion beam or an electron beam while either inclining the sample or inclining the ion beam or the electron beam. Otherwise, it is also possible to make use of the difference of focusing caused by the height of a sample. In a method for controlling an ion beam so as to flatten the obtained three-dimensional shape of the sample, the place and time of irradiation may be properly set for each location in scanning control. For example, a place lower than a flat level may be irradiated with an ion beam for a longer period of time. Consequently, the present invention makes it possible to: fill and flatten a hole formed by processing with an ion beam; and provide an ion beam processor suitable for returning a processed wafer to a production processing line.

Figure 13:
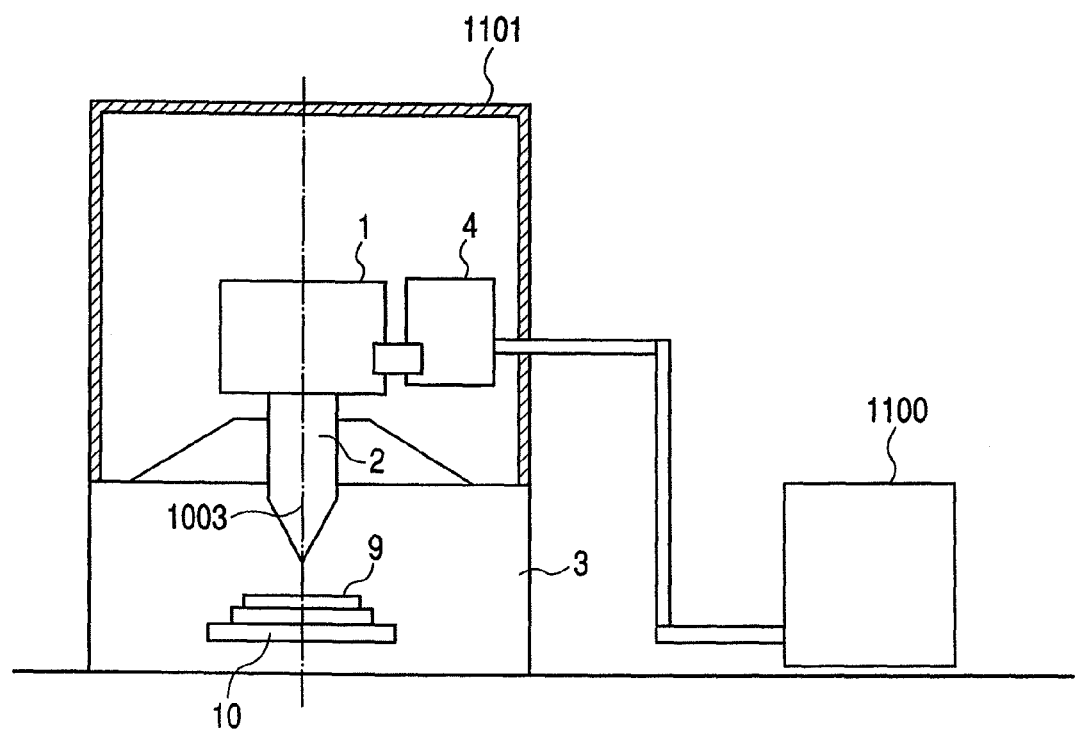
FIG. 13 is a configuration diagram of an ion beam microscope according to the fifth embodiment.

Further, it has been found that noise of a compressor 1100 to feed helium to the refrigerator 4 vibrates the gas field ion source and deteriorates the resolution. To cope with that, an apparatus cover 1101 to spatially separate the compressor of the refrigerator from the gas field ion source is installed as shown in FIG. 13. By so doing, it is possible to provide a gas field ion source and an ion microscope that can: shield the noise of the compressor of the refrigerator; further reduce the influence of vibration; and secure high resolution observation.

A turbo-molecular pump is used as the vacuum pump to vacuum a gas field ion source in the present embodiment but it has been found that, by using a nonvolatile getter pump and an ion pump or a noble pump, it is possible to: further reduce the influence of vibration; and provide a gas field ion source and an ion microscope that can secure high resolution observation. Here, the nonvolatile getter pump is a vacuum pump configured by using an alloy that can absorb gas due to the activation by heating. When helium is used as an ionization gas for a gas field ion source, although helium exists in a vacuum chamber relatively abundantly, since the nonvolatile getter pump scarcely evacuates the helium, the effect of being able to prolong the operation time of the nonvolatile getter pump while the getter surface is prevented from being saturated with absorbed gas molecules is obtained. This is the effect yielded by combining the helium ion microscope with the nonvolatile getter pump. Further, the effect of reducing impurity gas in the vacuum chamber and thus stabilizing ion emission current is also obtained. Although the nonvolatile getter pump evacuates residual gas other than helium at a large exhaust velocity, only by this measure, helium stagnates at the ion source, the degree of vacuum lowers, and the ion source does not work. To cope with the problem, the vacuum is maintained by combining an ion pump or a noble pump having a high exhaust velocity of an inert gas. If only the ion pump or the noble pump is used, a large pump is necessary for increasing the exhaust velocity and the structure comes to be complicated. In the present embodiment, a compact and low-cost ion source can be realized by combining a nonvolatile getter pump with an ion pump or a noble pump. Conventionally mechanical vibration has not sufficiently been taken into consideration and the performance of the ion microscope has been insufficient. By the present invention however, it is possible to provide a gas field ion source and an ion microscope that can realize the reduction of mechanical vibration and secure high resolution observation.

Consequently, the present invention makes it possible to provide a gas field ion source that can: simultaneously increase a conductance during rough vacuuming and reduce an extraction electrode aperture diameter from the viewpoint of the increase of ion current; and obtain an ion beam of a large electric current.

Further, by installing a nonvolatile getter pump in the middle of a helium gas feed pipe, impurity gas reduces in the supplied gas and thereby a gas field ion source and an ion microscope capable of stabilizing ion emission current can be provided.

Furthermore, the higher degree of vacuum in a gas molecule ionization chamber is realized and a gas field ion source capable of emitting highly-stable ions can be provided. It has been found that, by incorporating a nonvolatile getter material into an ionization chamber in particular, the effect of enhancing the degree of vacuum in the ionization chamber and stabilizing ion beam current is obtained. Yet further, it has been found that, by using hydrogen discharged by absorbing hydrogen into a nonvolatile getter material and heating the nonvolatile getter material as the ionization gas, the effect of realizing a compact and safe apparatus is obtained.

Further, it is possible to provide a gas field ion source that can realize the cryogenic temperature of an emitter and obtain an ion beam of large electric current. Furthermore, it is possible to provide a gas field ion source and an ion microscope that can realize the reduction of mechanical vibration and secure high resolution observation.

Further, it is possible to provide an apparatus and a cross-section observation method suitable for: forming a cross section through processing with an ion beam; and observing the cross section at a high resolution with an ion microscope.

Furthermore, it is possible to provide an apparatus that: facilitates elemental analysis of a sample by installing a mass spectrometer in a sample chamber; and can carry out sample observation and elemental analysis with an ion microscope in the single apparatus.

Consequently, the present invention makes it possible to provide: an apparatus capable of sample observation with an ion microscope and sample observation and elemental analysis with an electron microscope in the single apparatus; an analyzer suitable for observing and analyzing defects and foreign matters and measuring the dimension of a structure on a sample; and an ion beam length measuring apparatus or an inspection apparatus.

Further, in an inspection apparatus to measure the dimension of an object on a sample by irradiating the sample in a semiconductor device production process with ions emitted from a gas field ion source and detecting the particles emitted from the sample, it has been found that, by controlling energy of an ion beam applied on the sample to less than 1 kV, damages to the sample can be reduced and the electrical characteristics of the device are not adversely affected even when a wafer after measured is sent back to the process. In particular, by applying positive bias voltages to a sample in measurement, for example an ion accelerating voltage of plus 2 kV and an applied voltage to the sample of plus 1.5 kV, and controlling the energy of the ion beam applied to the sample to less than 1 kV, the effect of being able to increase the ion irradiation current and secure highly accurate measurement is obtained. Further, since the focal depth of an obtained image is deeper than the focal depth in the case of conventional measurement with an electron beam, the effect of being able to secure highly accurate measurement is obtained. Furthermore, by using a hydrogen ion beam in particular, the effect of reducing the amount shaved from a sample surface and being able to secure highly accurate measurement is obtained. Consequently, the present invention makes it possible to provide an ion beam length measuring apparatus suitable for measuring the dimension of a structure on a sample or an inspection apparatus.

What is claimed is:
1. A charged particle microscope comprising:
   a gas field ion source including an acicular anode emitter tip, a gas molecule ionization chamber that supplies gas molecules to the vicinity of the apex of the emitter tip and ionizes the gas molecules by an electric field at the apex of the emitter tip, and a vacuuming system;
a lens system that focuses an ion beam extracted from the gas molecule ionization chamber;
a secondary particle detector that detects secondary particles; and
an image display unit that displays an ion microscopic image,
wherein the charged particle microscope has a mechanism to change a conductance in the vacuuming of the gas molecule ionization chamber in accordance with whether or not the ion beam is extracted from the gas molecule ionization chamber.

2. A charged particle microscope including:
a gas field ion source having an acicular anode emitter tip, a gas molecule ionization chamber that supplies gas molecules to the vicinity of the apex of the emitter tip and ionizes the gas molecules by an electric field at the apex of the emitter tip, and a vacuuming system;
an electrostatic lens system to focus an ion beam extracted from the gas molecule ionization chamber;
a secondary particle detector to detect secondary particles; and
an image display unit to display an ion microscopic image, the charged particle microscope further comprising:
a system to cool the emitter tip and the gas molecule ionization chamber; and
a system to cool at least one of the electrodes of an electrostatic lens constituting the electrostatic lens system facing the gas molecule ionization chamber.

3. The charged particle microscope according to claim 2, wherein a coolant in the system to cool at least one of the electrodes of the electrostatic lens is a solid state coolant that is in the state of a gas at room temperature under atmospheric pressure.

4. A composite apparatus composed of a gallium focused ion beam and an ion microscope, comprising:
a gas field ion source including an acicular anode emitter tip, the apex of the emitter tip having a nano-pyramid structure, and a gas molecule ionization chamber that supplies apex of the emitter tip and ionizes the helium molecules or the hydrogen molecules by an electric field;
a lens system that focuses a helium or hydrogen ion beam extracted from the gas molecule ionization chamber;
a liquid metal ion source that discharges gallium;
a lens system that focuses a gallium ion beam extracted from the liquid metal ion source;
a vacuum sample chamber;
a sample stage on which a sample is mounted; and
a secondary particle detector to detect secondary particles emitted from the sample,
wherein a nearly identical position of the sample can be irradiated with the helium or hydrogen ion beam and the gallium ion beam;
wherein the ion beam irradiation axis of the ion microscope is nearly vertical to the installation plane of the composite apparatus; and
wherein the irradiation axis of the gallium focused ion beam is directed to a direction inclining to the installation plane of the composite apparatus.

5. A composite apparatus composed of a gallium focused ion beam and an ion microscope, comprising:
a gas field ion source including an acicular anode emitter tip, a nano-pyramid structure formed at the apex of the emitter tip, and a gas molecule ionization chamber that supplies helium molecules or hydrogen molecules to the vicinity of the apex of the emitter tip and ionizes the helium molecules or the hydrogen molecules by an electric field;
a refrigerator that cools at least the gas molecule ionization chamber;
a lens system that focuses a helium or hydrogen ion beam extracted from the gas molecule ionization chamber;
a liquid metal ion source that discharges gallium;
a lens system that focuses a gallium ion beam extracted from the liquid metal ion source;
a vacuum sample chamber;
a sample stage on which a sample is mounted; and
a secondary particle detector that detects secondary particles emitted from the sample,
wherein a nearly identical position of the sample can be irradiated with the helium or hydrogen ion beam and the gallium focused ion beam;
wherein the refrigerator is installed In the transverse direction vertical to the ion beam irradiation axis of the ion microscope; and
wherein the side where the refrigerator is installed is the side opposite to the gallium focused ion beam irradiation axis side of the ion beam irradiation axis of the ion microscope.

6. A composite apparatus composed of an electron beam microscope and an ion microscope, comprising:
a gas field ion source including an acicular anode emitter tip, a nano-pyramid structure formed at the apex of the emitter tip, and a gas molecule ionization chamber that supplies helium molecules or hydrogen molecules to the vicinity of the apex of the emitter tip and ionizes the helium molecules or the hydrogen molecules by an electric field;
an ion beam irradiation column having a lens system that focuses a helium or hydrogen ion beam extracted from the gas molecule ionization chamber;
an electron source that emits electrons;
an electron beam irradiation column having a lens system that focuses an electron beam extracted from the electron source;
a vacuum sample chamber; a sample stage on which a sample is mounted;
a secondary particle detector that detects secondary particles emitted from the sample; and
an X-ray detector that detects an X-ray emitted from the sample,
wherein the ion beam irradiation column and the electron beam irradiation column are allocated so that a nearly identical position of the sample may be irradiated with the helium or hydrogen ion beam and the electron beam; and
wherein the place of the X-ray detector installation in the vacuum sample chamber is maintained on the side of the electron beam irradiation column installation when the vacuum sample chamber is divided into half to the electron beam irradiation column installation side and to the other side of the center of the ion beam irradiation column installation.

7. A composite apparatus composed of an electron beam microscope and an ion microscope, comprising:
a gas field ion source including an acicular anode emitter tip, a nano-pyramid structure formed at the apex of the emitter tip, and a gas molecule ionization chamber that supplies helium molecules or hydrogen molecules to the vicinity of the apex of the emitter tip and ionizes the helium molecules or the hydrogen molecules by an electric field;
a lens system that focuses a helium or hydrogen ion beam extracted from the gas molecule ionization chamber; an electron source that emits electrons;
a lens system that focuses an electron beam extracted from the electron source;
a vacuum sample chamber; a sample stage on which a sample is mounted; and
a secondary particle detector that detects secondary particles emitted from the sample,
wherein the ion beam irradiation axis of the ion microscope is nearly vertical to the installation plane of the composite apparatus; and
wherein the irradiation axis of the electron beam is directed to a direction inclining to the installation plane of the composite apparatus.

8. The composite apparatus composed of an electron microscope and an ion microscope according to claim 7, wherein the ion beam irradiation axis of the ion microscope and the electron beam irradiation axis are allocated apart from each other so as not to intersect with each other on a sample.

9. An ion beam length measuring apparatus comprising:
a gas field ion source Including an acicular anode emitter tip, a gas molecule ionization chamber to supply gas molecules to the vicinity of the apex of the emitter tip and ionize the gas molecules by an electric field at the apex of the emitter tip; and
a vacuuming system;
an electrostatic lens system to focus an ion beam extracted from the gas molecule ionization chamber; and
a secondary particle detector that detects secondary particles, the ion beam length measuring apparatus measuring the dimensions of a structure on a sample by using signals obtained with the secondary particle detector, wherein the energy used for the irradiation of a sample is less than 1 kV.

10. The charged particle microscope comprising:
an acicular anode emitter tip;
a gas molecule ionization chamber to supply gas molecules to the vicinity of the apex of the emitter tip and ionize the gas molecules by an electric field at the apex of the emitter tip; and
a vacuuming system that includes a non-evaporable getter pump and an ion pump or a noble pump.

11. An apparatus comprising:
a charged particle microscope, the charged particle microscope comprising:
an acicular anode emitter tip;
a gas field ion source to supply helium molecules to the vicinity of the apex of the emitter tip and ionize the helium molecules by an electric field at the apex of the emitter tip; and
a vacuuming system that includes a non-evaporable getter pump and an ion pump or a noble pump.

12. The charged particle microscope comprising:
an acicular anode emitter tip;
a gas field ion source to supply helium molecules to the vicinity of the apex of the emitter tip and ionize the helium molecules by an electric field, at the apex of the emitter tip; and
a helium gas feed pipe includes a non evaporable getter pump.

13. The charged particle microscope comprising:
an acicular anode emitter tip;
a gas molecule ionization chamber to supply gas molecules to the vicinity of the apex of the emitter tip and ionize the gas molecules by an electric field at the apex of the emitter tip; and
the gas molecule ionization chamber includes a non evaporable getter material.

* * * * *